(12) United States Patent
Greene et al.

(10) Patent No.: US 8,779,469 B2
(45) Date of Patent: Jul. 15, 2014

(54) POST-GATE SHALLOW TRENCH ISOLATION STRUCTURE FORMATION

(71) Applicant: International Business Machines Corporation, Armonk, NY (US)

(72) Inventors: Brian J. Greene, Wappingers Falls, NY (US); Yue Liang, Sunnyvale, CA (US); Xiaojun Yu, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/080,931

(22) Filed: Nov. 15, 2013

(65) Prior Publication Data

US 2014/0070274 A1    Mar. 13, 2014

Related U.S. Application Data

(62) Division of application No. 13/277,259, filed on Oct. 20, 2011.

(51) Int. Cl.
*H01L 21/02* (2006.01)

(52) U.S. Cl.
USPC .............. 257/190; 438/412; 257/E21.545

(58) Field of Classification Search
None
See application file for complete search history.

(56) References Cited

U.S. PATENT DOCUMENTS

| | | |
|---|---|---|
| 3,651,517 A | 3/1972 | Kurek et al. |
| 4,130,768 A | 12/1978 | Bula et al. |
| 4,276,487 A | 6/1981 | Arzubi et al. |
| 4,418,291 A | 11/1983 | Watson, Jr. |
| 5,168,182 A | 12/1992 | Salerno et al. |
| 5,643,822 A | 7/1997 | Furukawa et al. |
| 5,773,328 A | 6/1998 | Blanchard |
| 5,777,370 A | 7/1998 | Omid-Zohoor et al. |
| 5,798,553 A | 8/1998 | Furukawa et al. |
| 5,858,825 A | 1/1999 | Alsmeier et al. |
| 5,874,317 A | 2/1999 | Stolmeijer |
| 5,891,771 A | 4/1999 | Wu et al. |
| 5,960,276 A | 9/1999 | Liaw et al. |
| 5,981,318 A | 11/1999 | Blanchard |
| 5,982,017 A | 11/1999 | Wu et al. |
| 6,081,662 A | 6/2000 | Murakami et al. |
| 6,093,593 A | 7/2000 | Jang |
| 6,133,116 A | 10/2000 | Kim et al. |
| 6,228,745 B1 | 5/2001 | Wheeler et al. |
| 6,268,629 B1 | 7/2001 | Noguchi |
| 6,271,093 B1 | 8/2001 | Alsmeier et al. |
| 6,274,419 B1 | 8/2001 | Omid-Zohoor et al. |
| 6,284,623 B1 | 9/2001 | Zhang et al. |

(Continued)

*Primary Examiner* — Sonya D McCall Shepard
(74) *Attorney, Agent, or Firm* — Scully, Scott, Murphy & Presser, P.C.; H. Daniel Schnurmann

(57) ABSTRACT

Doped wells, gate stacks, and embedded source and drain regions are formed on, or in, a semiconductor substrate, followed by formation of shallow trenches in the semiconductor substrate. The shallow trenches can be formed by forming a planarized material layer over the doped wells, the gate stacks, and the embedded source and drain regions; patterning the planarized material layer; and transferring the pattern in the planarized material layer into the gate stacks, embedded source and drain regions, and the doped wells. The shallow trenches are filled with a dielectric material to form shallow trench isolation structures. Alternately, the shallow trenches can be formed by applying a photoresist over the doped wells, the gate stacks, and the embedded source and drain regions, and subsequently etching exposed portions of the underlying structures. After removal of the photoresist, shallow trench isolation structures can be formed by filling the shallow trenches.

12 Claims, 26 Drawing Sheets

(56) References Cited

U.S. PATENT DOCUMENTS

| | | |
|---|---|---|
| 6,291,845 B1 | 9/2001 | Blanchard |
| 6,468,910 B1 | 10/2002 | Srinivasan et al. |
| 6,479,369 B1 | 11/2002 | Miyoshi |
| 6,482,718 B2 | 11/2002 | Shiozawa et al. |
| 6,491,843 B1 | 12/2002 | Srinivasan et al. |
| 6,492,220 B2 | 12/2002 | Ikeda |
| 6,537,895 B1 | 3/2003 | Miller et al. |
| 6,544,892 B2 | 4/2003 | Srinivasan et al. |
| 6,548,866 B2 | 4/2003 | Noguchi |
| 6,555,442 B1 | 4/2003 | Pai et al. |
| 6,566,224 B1 | 5/2003 | Chang et al. |
| 6,597,026 B2 | 7/2003 | Ogura |
| 6,627,107 B2 | 9/2003 | Srinivasan et al. |
| 6,642,536 B1 | 11/2003 | Xiang et al. |
| 6,723,617 B1 | 4/2004 | Choi |
| 6,780,730 B2 | 8/2004 | Lin |
| 6,897,707 B2 | 5/2005 | Beck |
| 6,922,199 B2 | 7/2005 | Hunter |
| 6,960,781 B2 | 11/2005 | Currie et al. |
| 7,091,164 B2 | 8/2006 | Srinivasan et al. |
| 7,119,812 B2 | 10/2006 | Hunter |
| 7,145,577 B2 | 12/2006 | Hunter |
| 7,157,350 B2 | 1/2007 | Yang et al. |
| 7,176,104 B1 | 2/2007 | Chen et al. |
| 7,205,996 B2 | 4/2007 | Hunter |
| 7,222,060 B2 | 5/2007 | Shimizu et al. |
| 7,238,588 B2 | 7/2007 | Xiang |
| 7,369,138 B2 | 5/2008 | Hunter |
| 7,387,925 B2 * | 6/2008 | Shang et al. ............... 438/197 |
| 7,480,604 B2 | 1/2009 | Bianchi |
| 7,504,704 B2 | 3/2009 | Currie et al. |
| 7,560,775 B2 | 7/2009 | Takamura et al. |
| 7,675,526 B2 | 3/2010 | Hunter |
| 7,804,152 B2 | 9/2010 | Yeh et al. |
| 7,892,941 B2 | 2/2011 | Pan |
| 7,906,407 B2 | 3/2011 | Rossi et al. |
| 2003/0027401 A1 | 2/2003 | Iyer et al. |

* cited by examiner

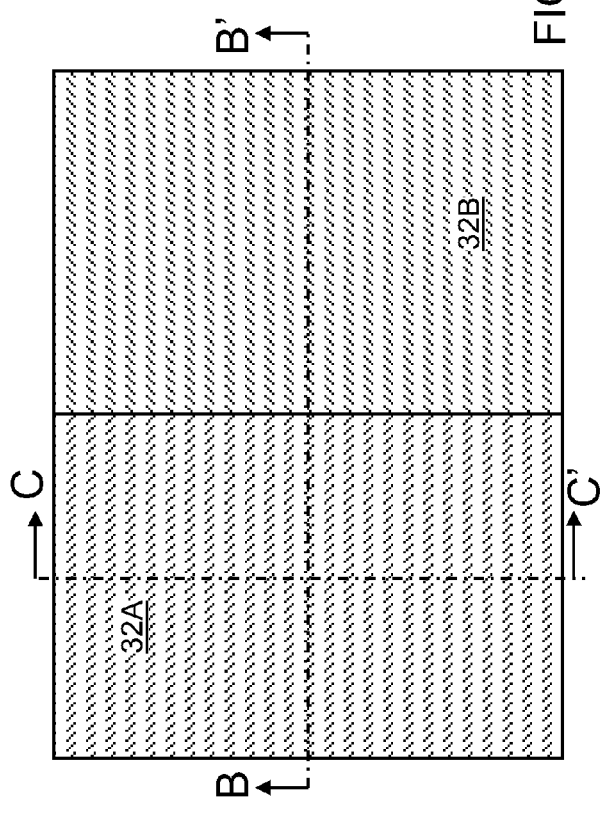
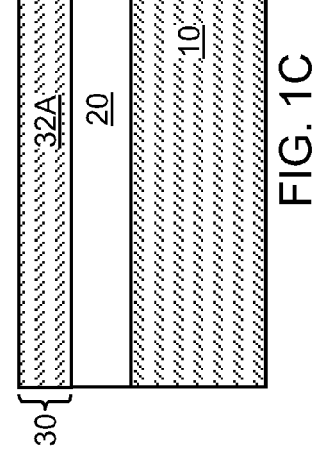
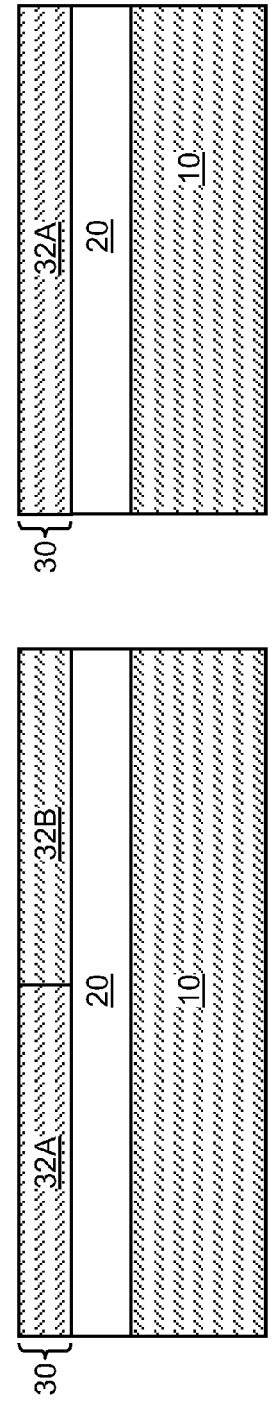
FIG. 1A
FIG. 1B
FIG. 1C

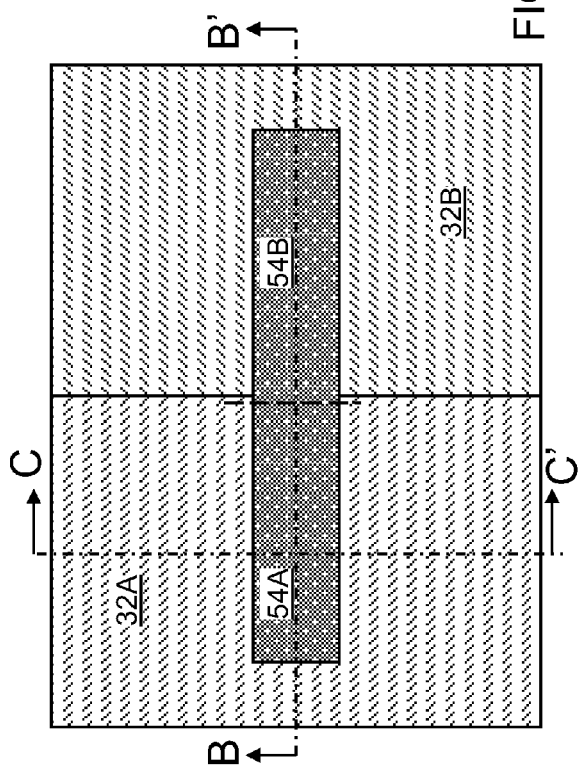
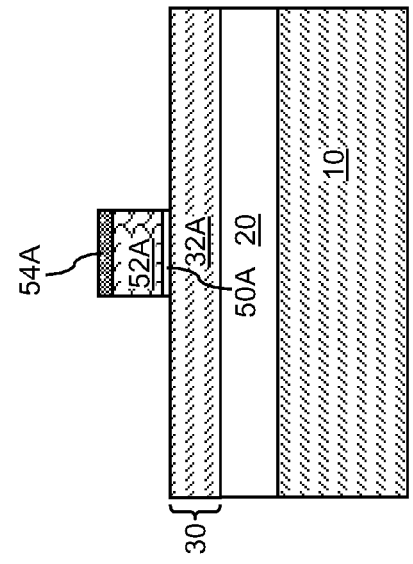
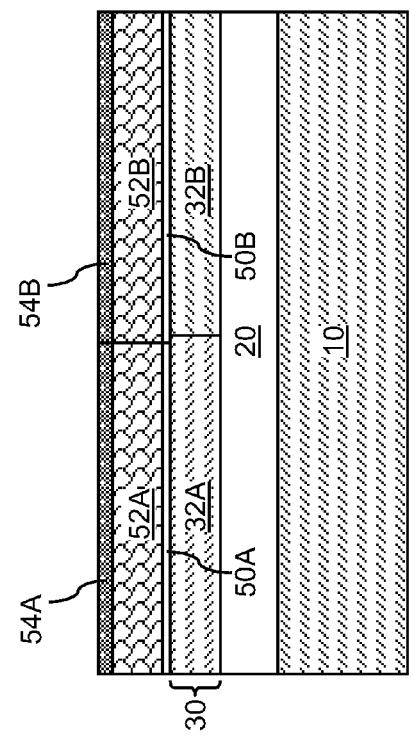
FIG. 2A
FIG. 2B
FIG. 2C

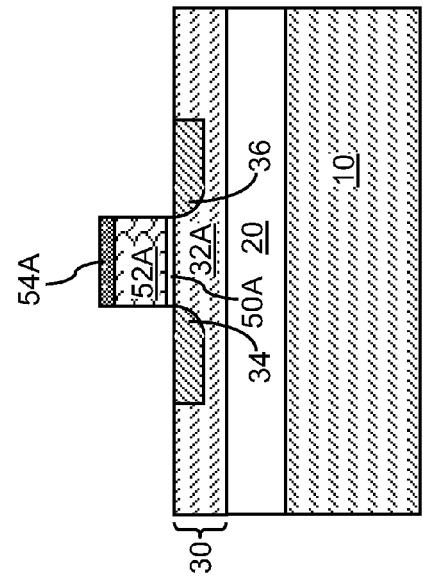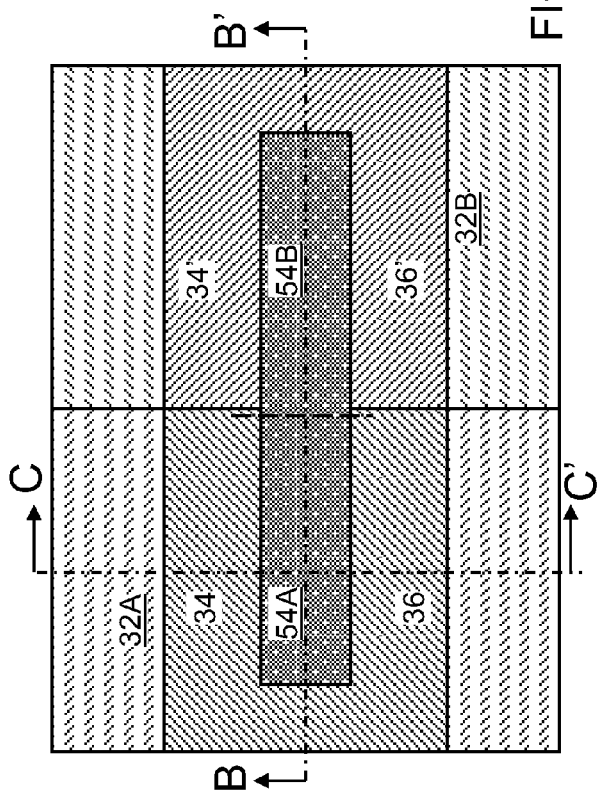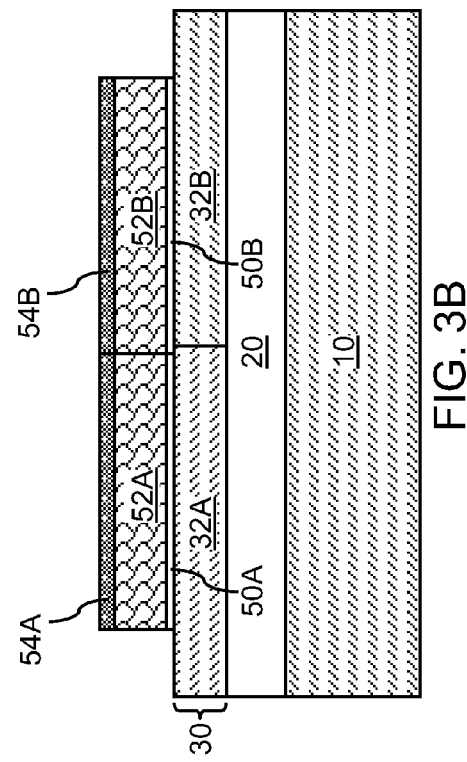

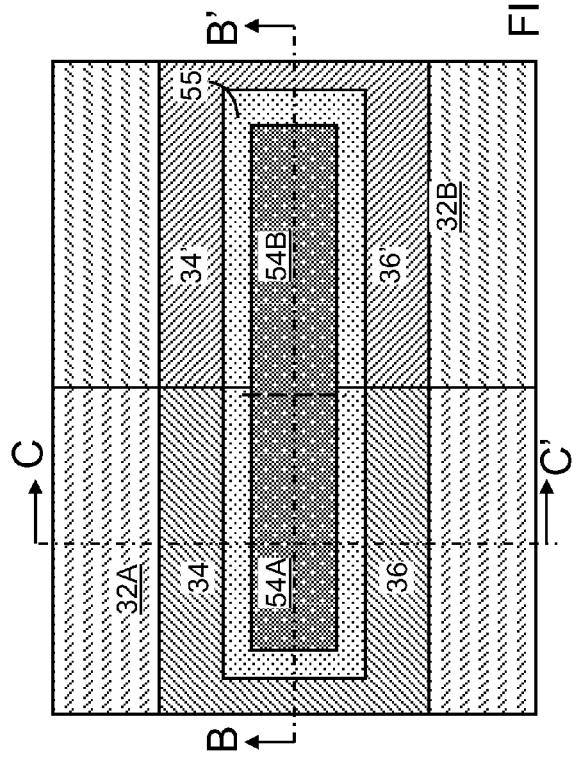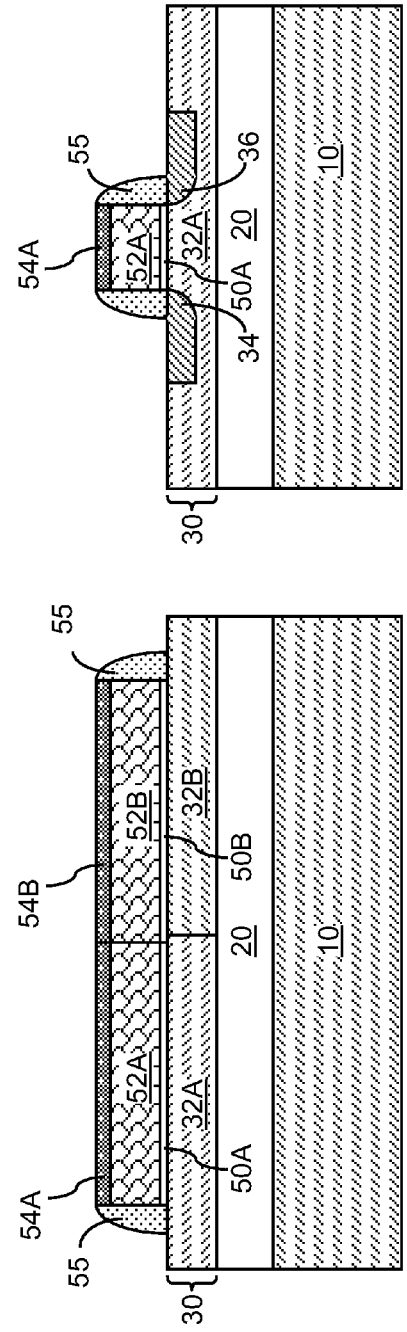

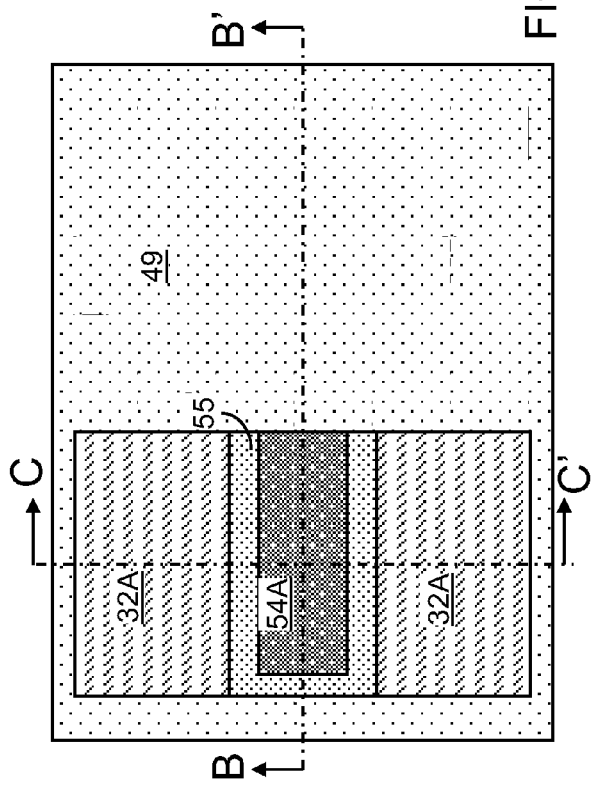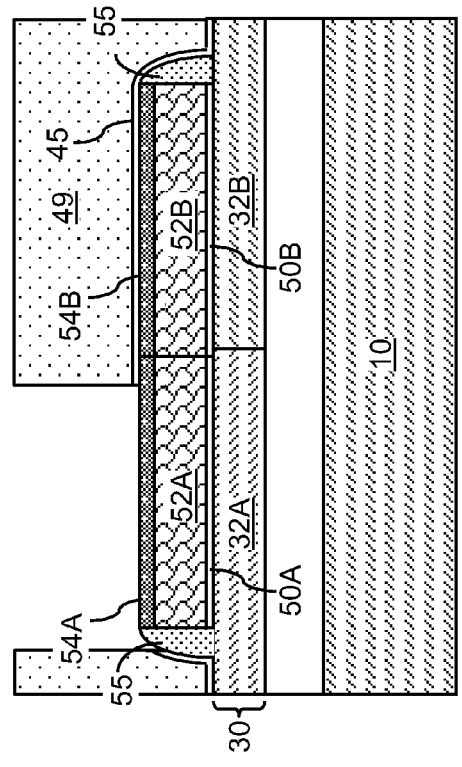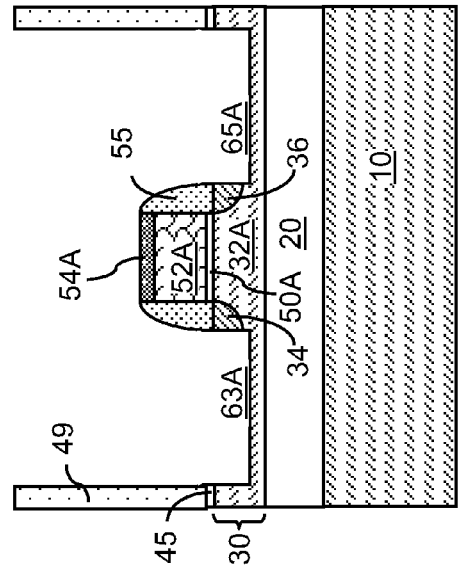

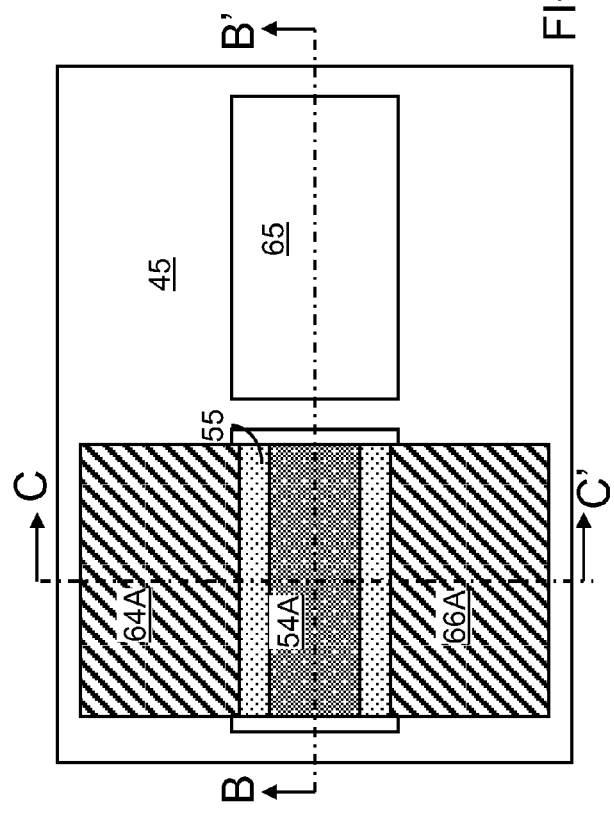
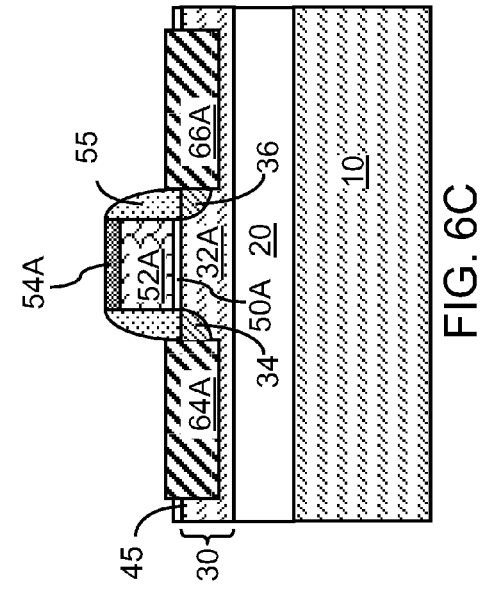
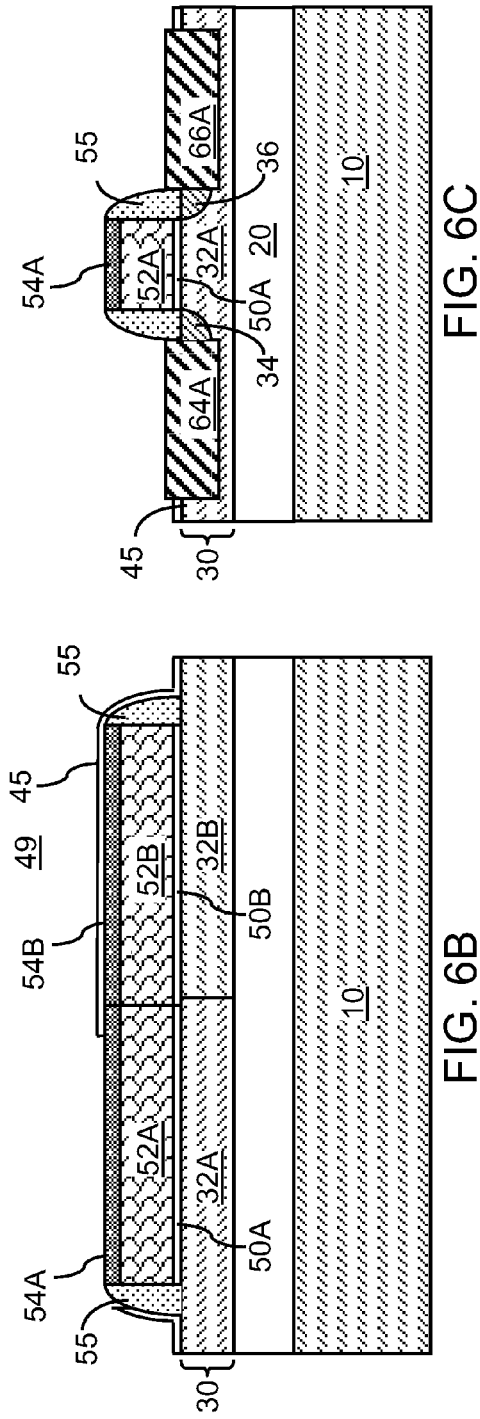

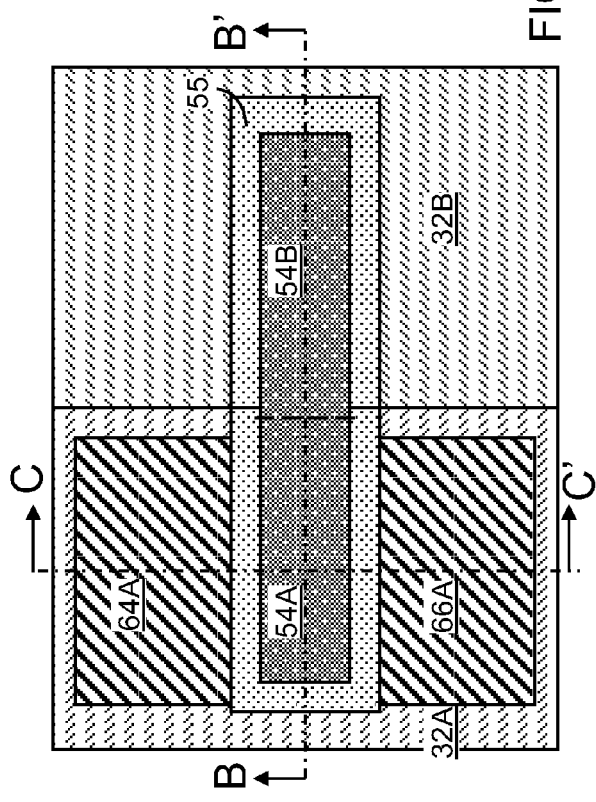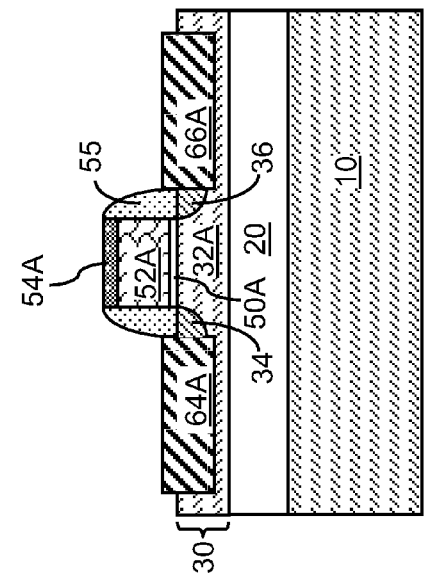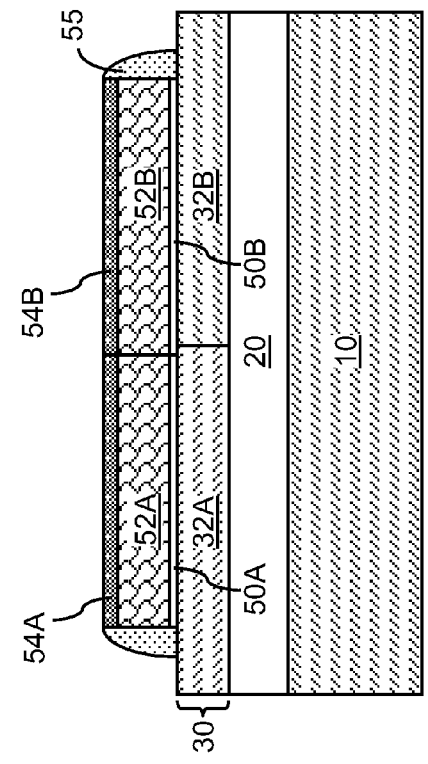

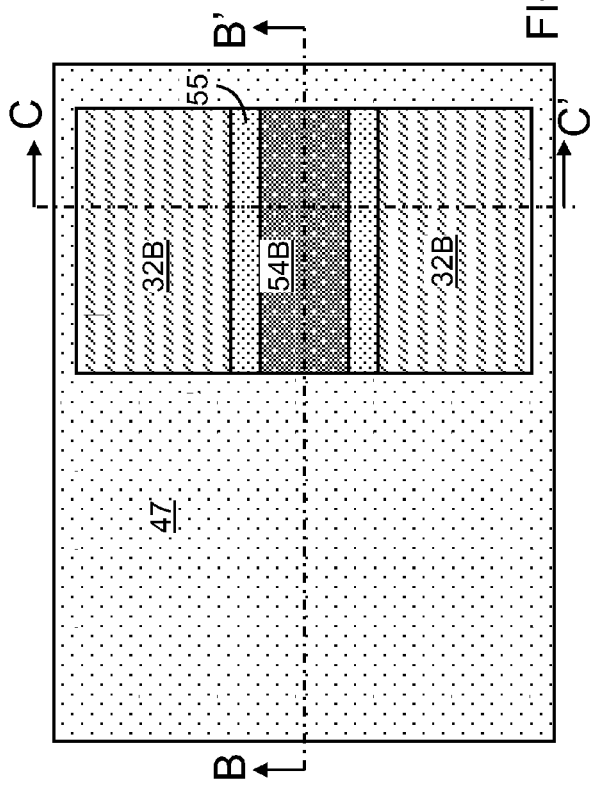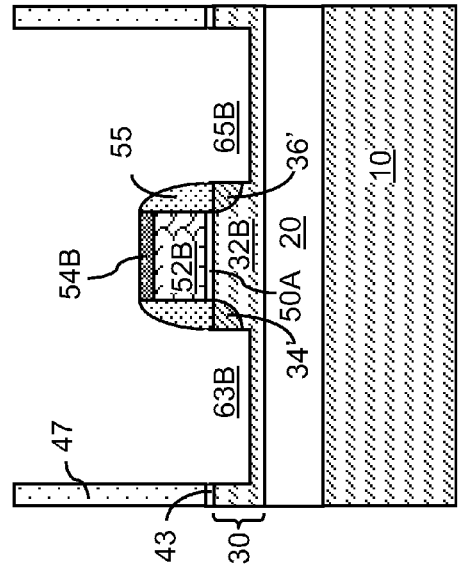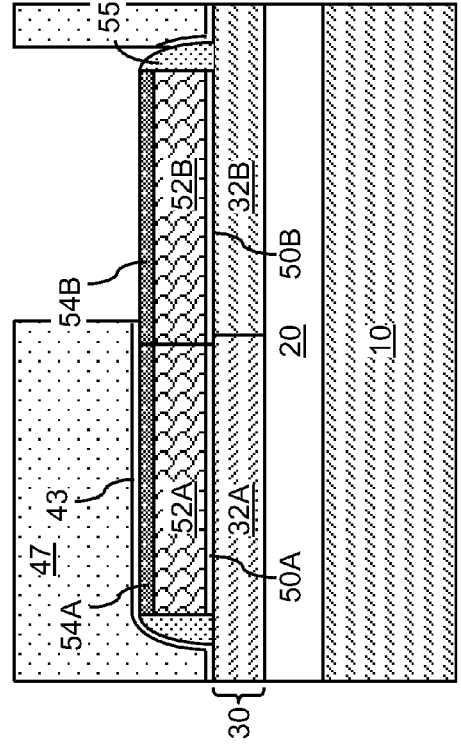

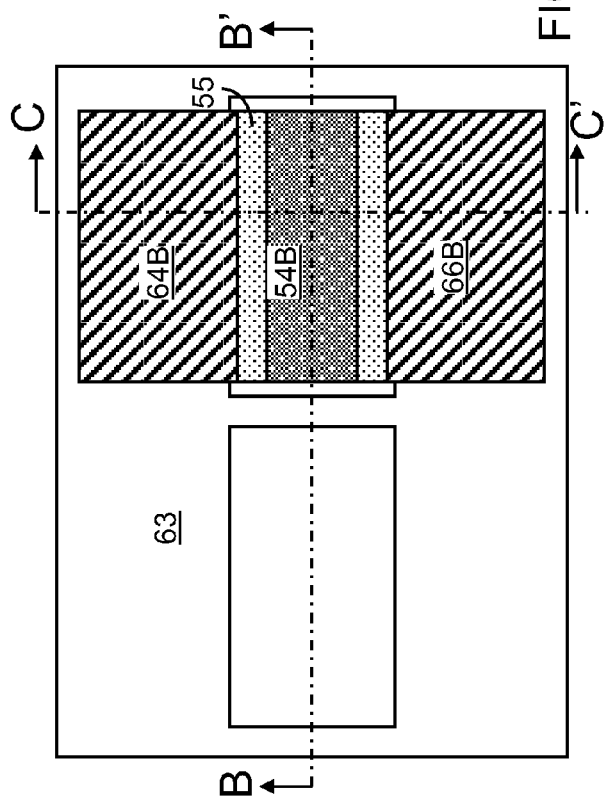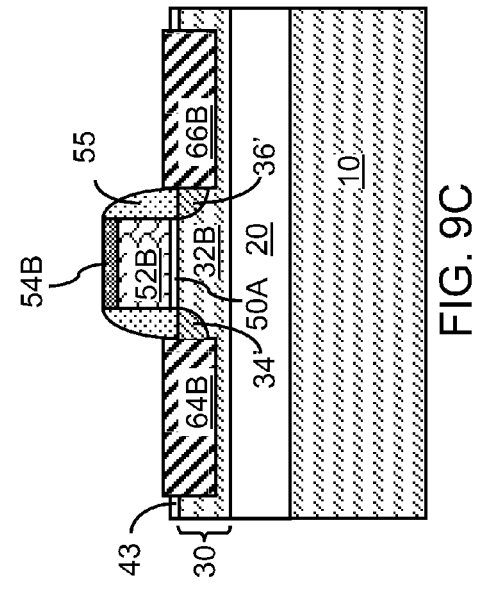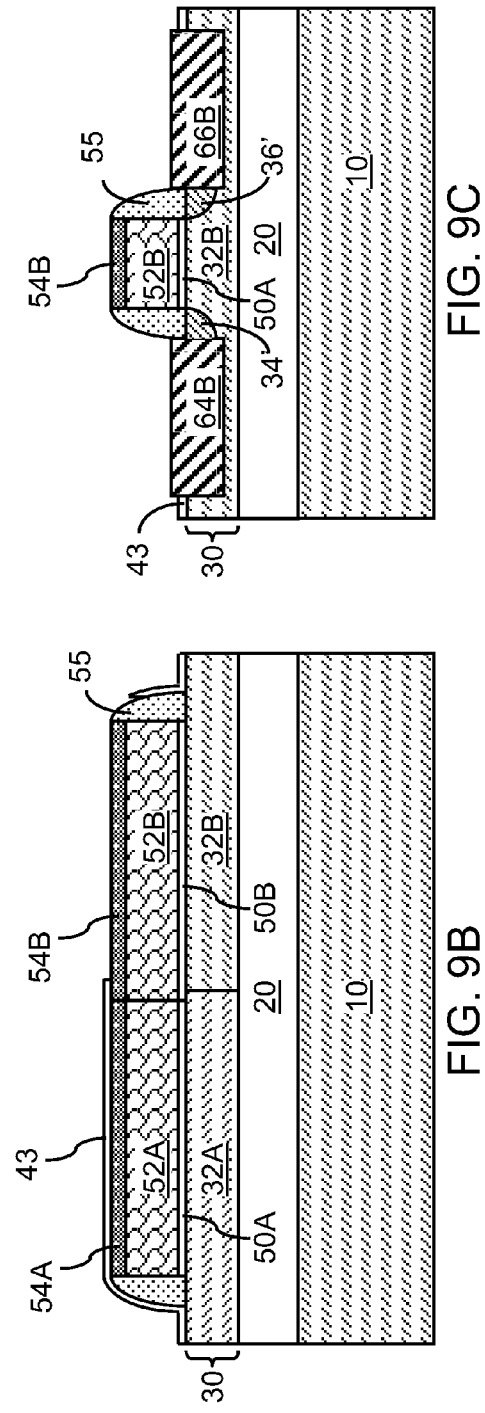

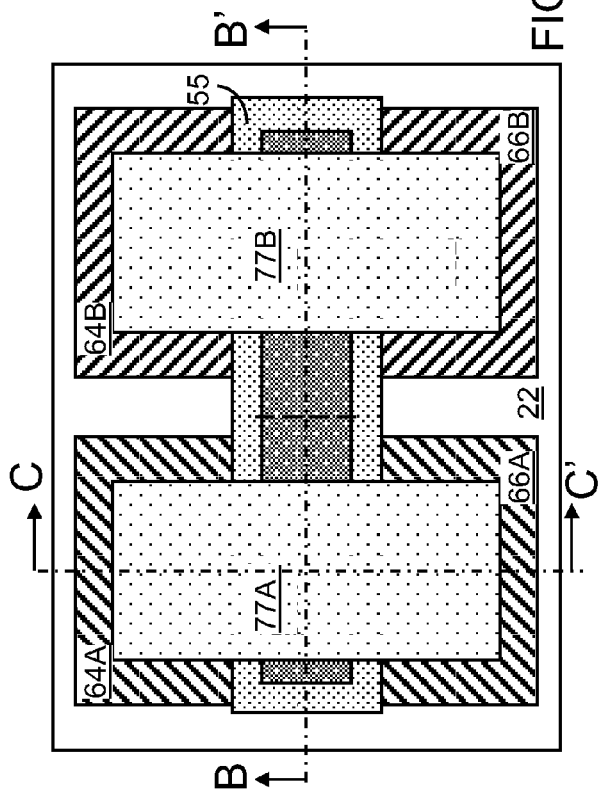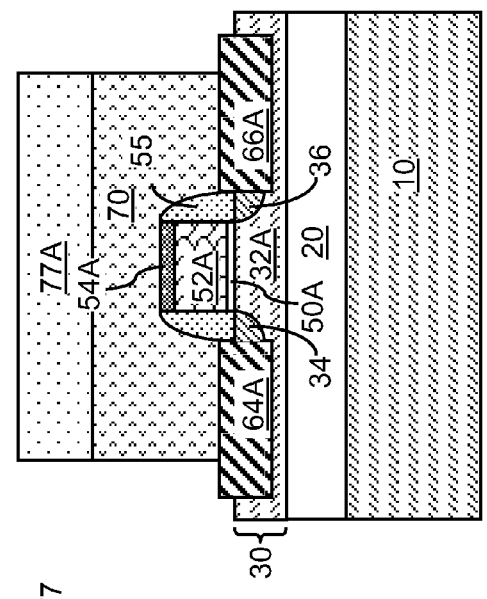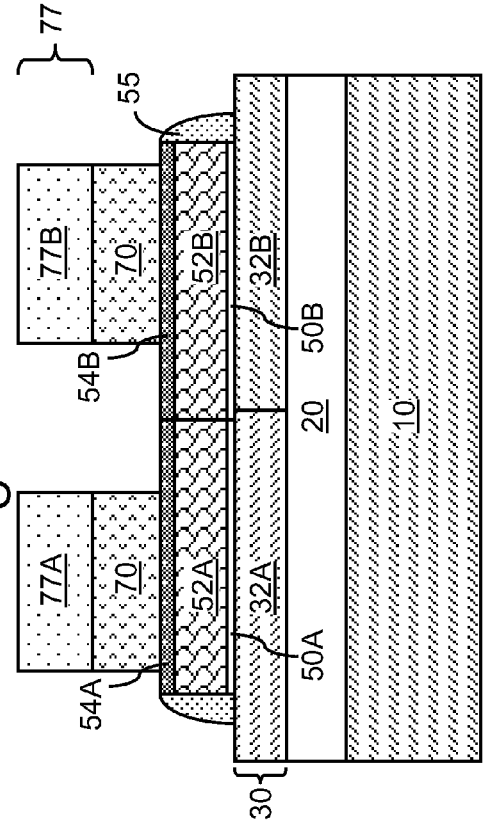

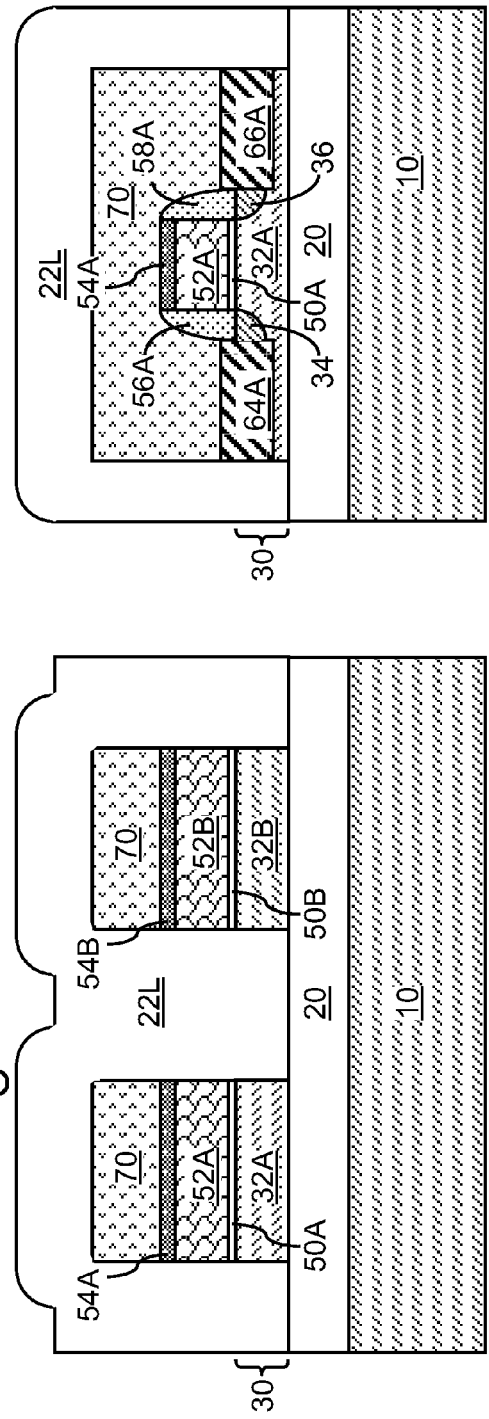

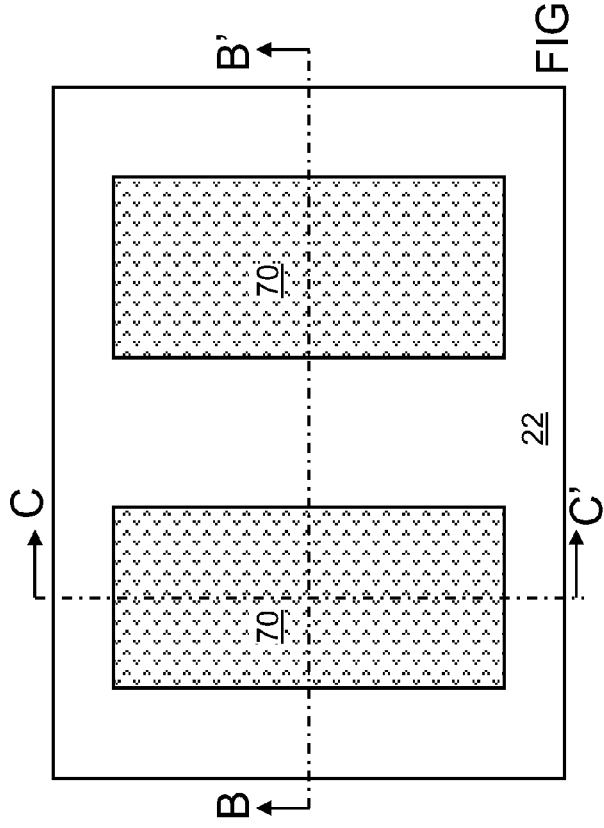
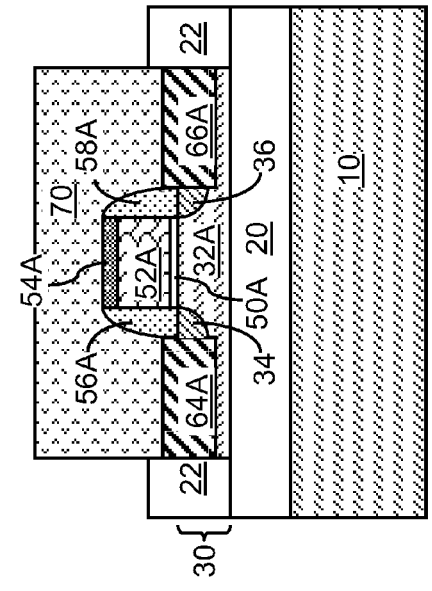
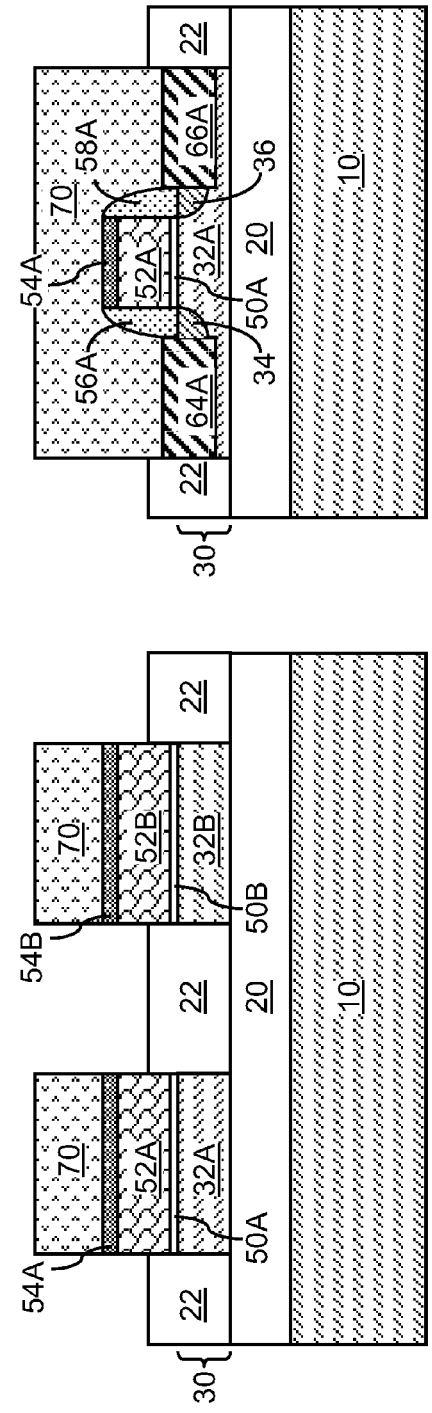

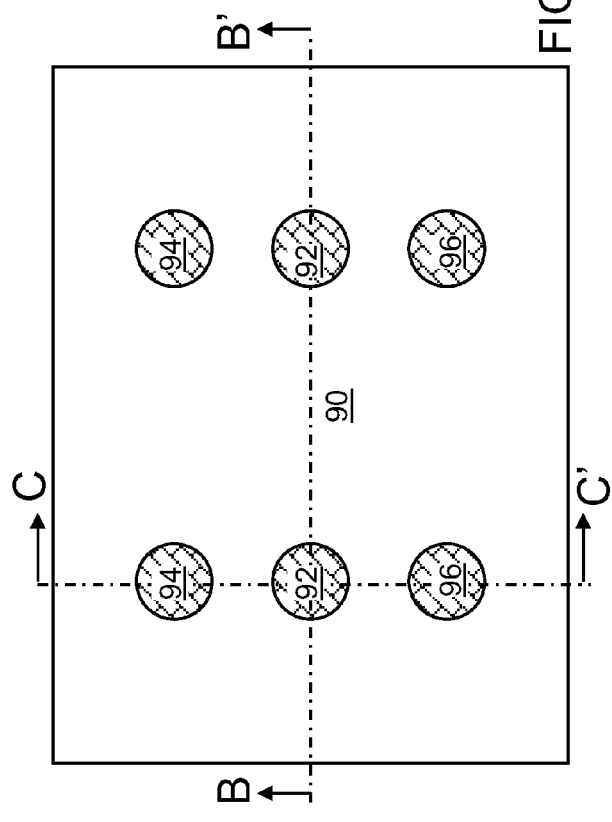
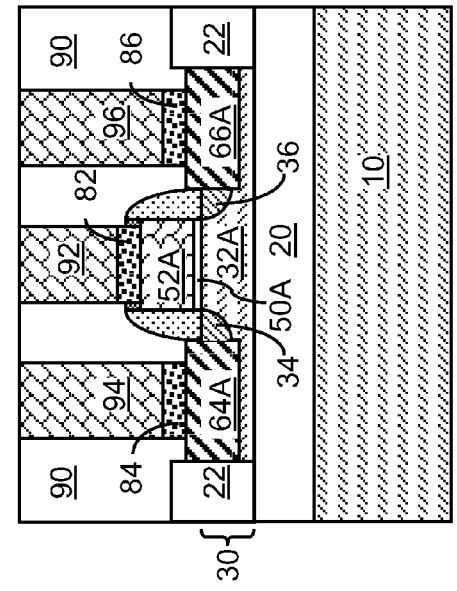
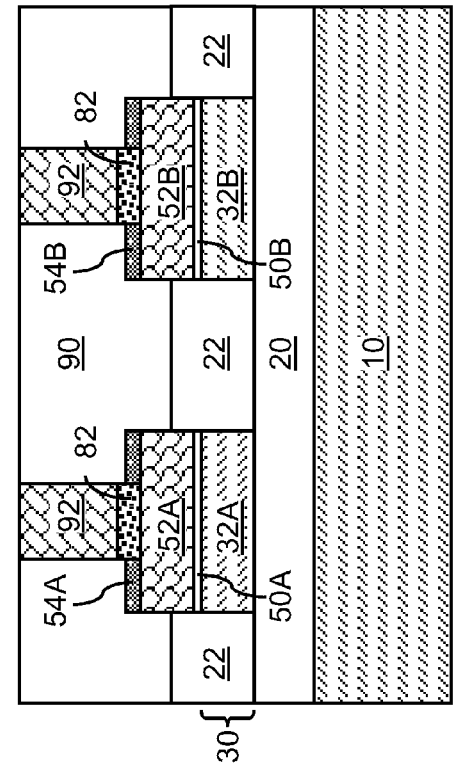
FIG. 17A
FIG. 17B
FIG. 17C

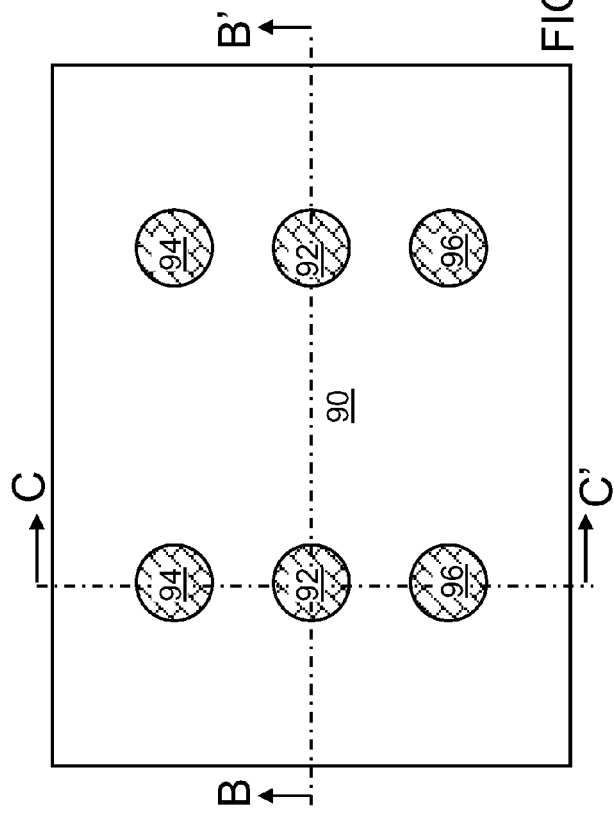
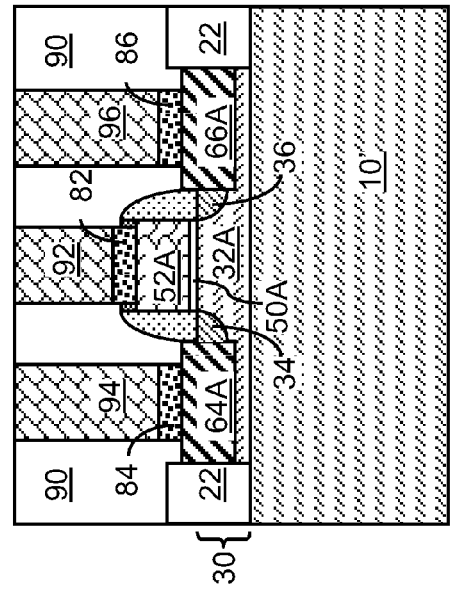
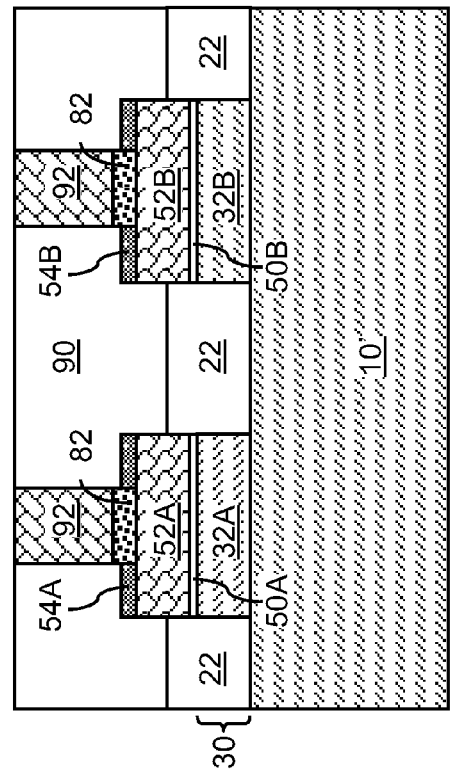
FIG. 18A
FIG. 18C
FIG. 18B

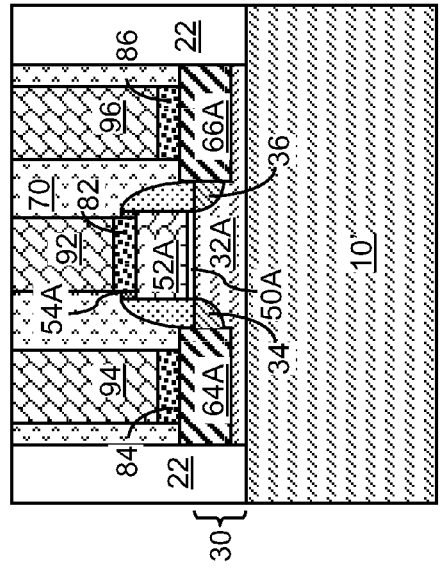
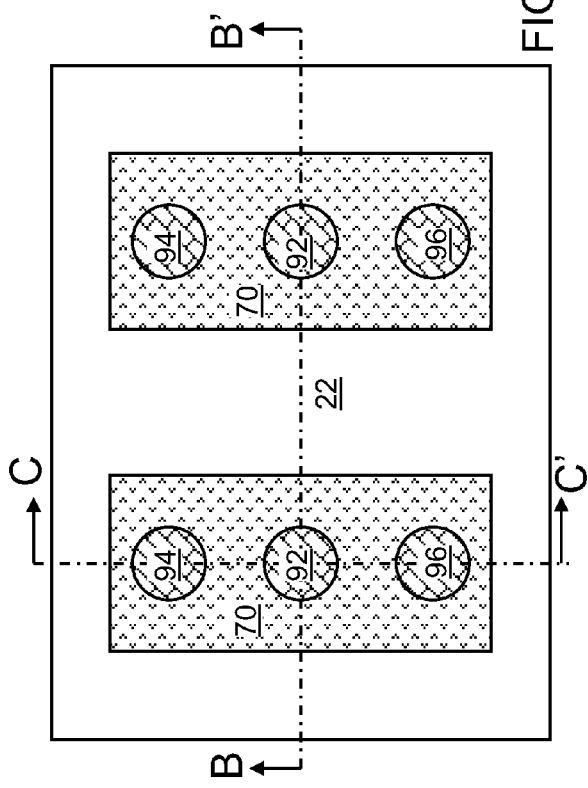
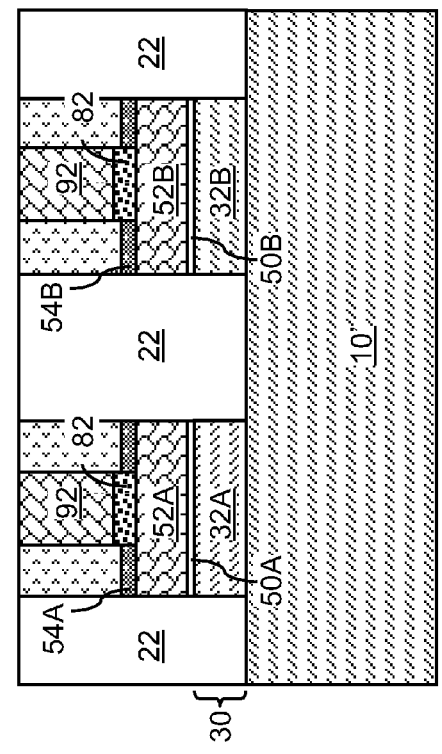

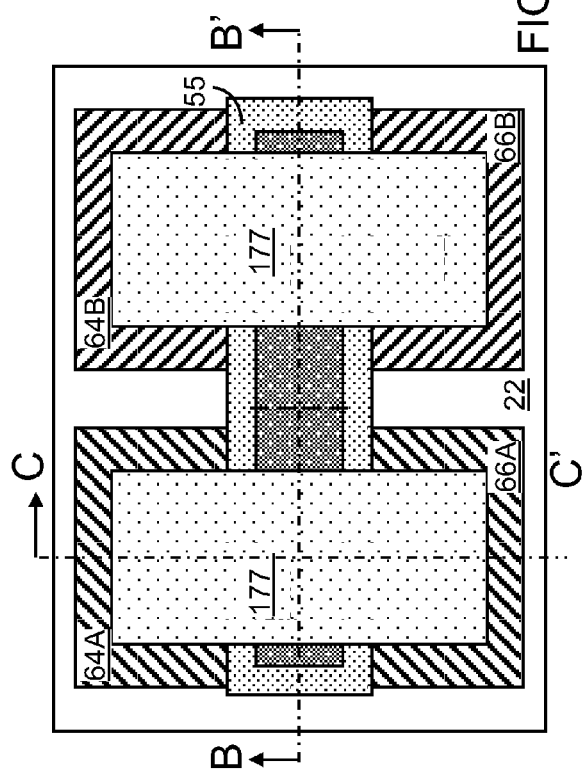
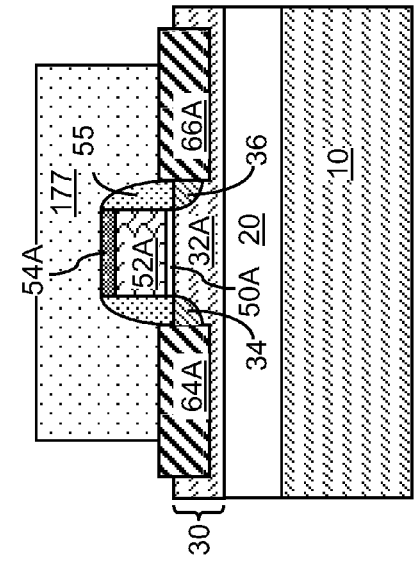
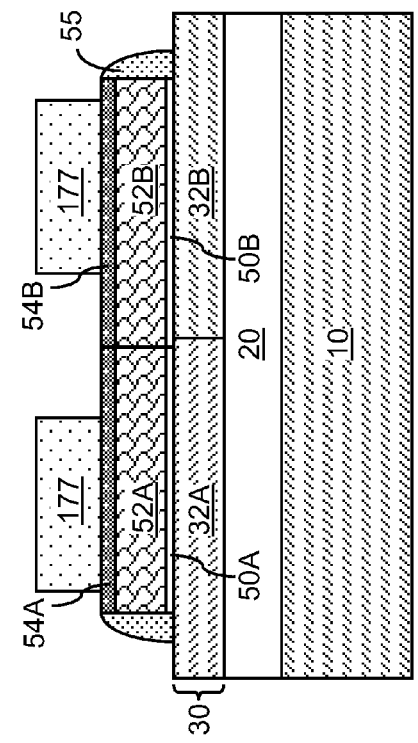
FIG. 22A
FIG. 22B
FIG. 22C

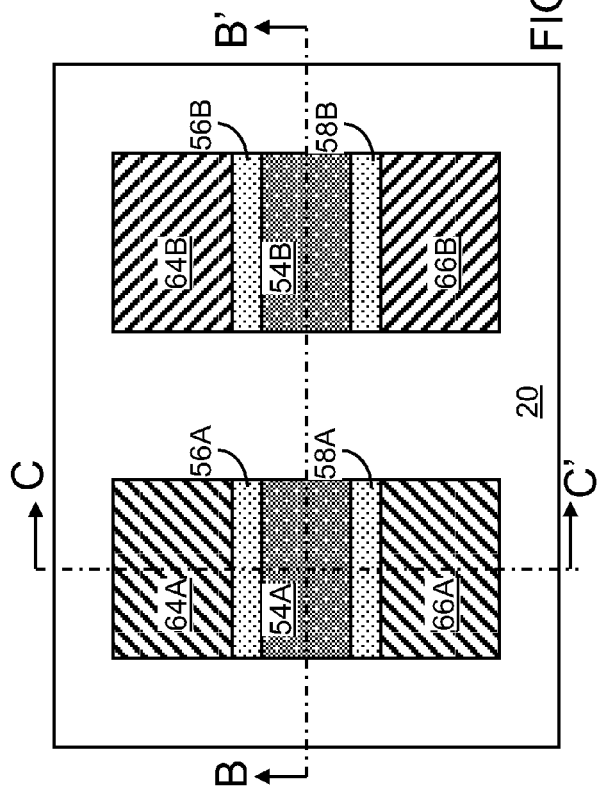
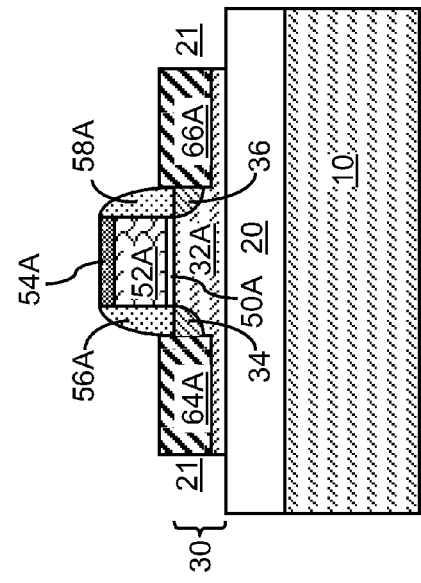
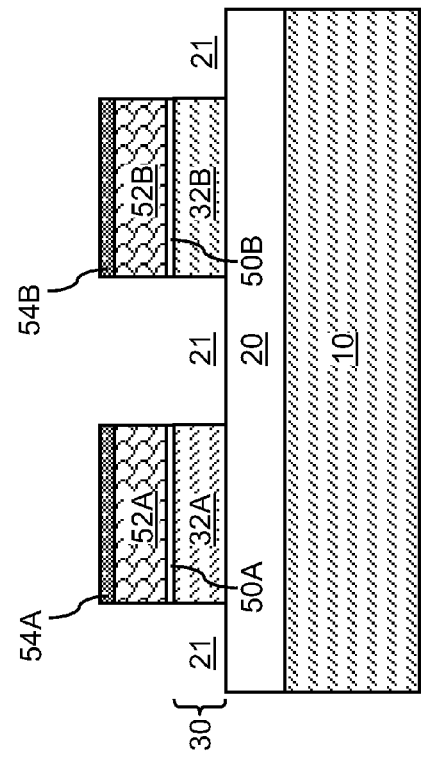
FIG. 23A
FIG. 23B
FIG. 23C

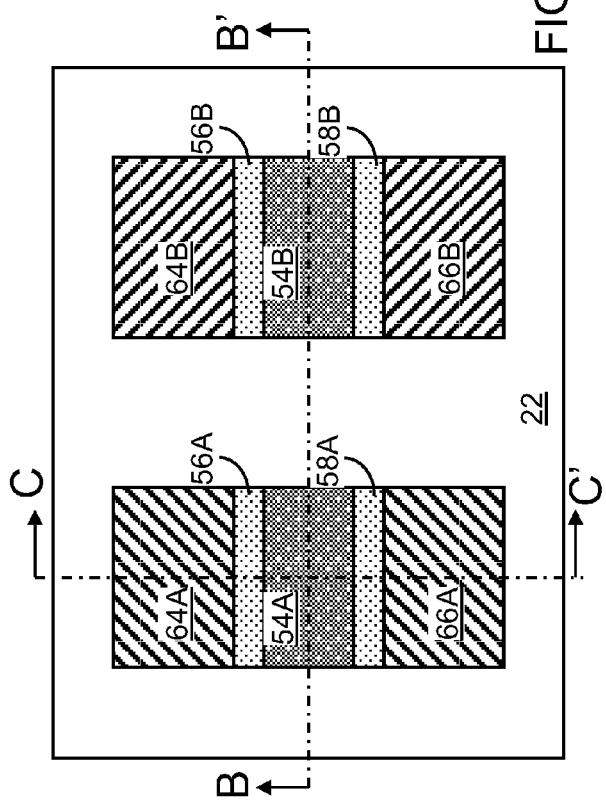
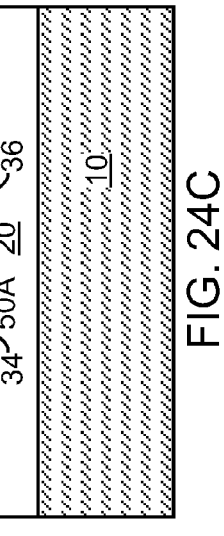
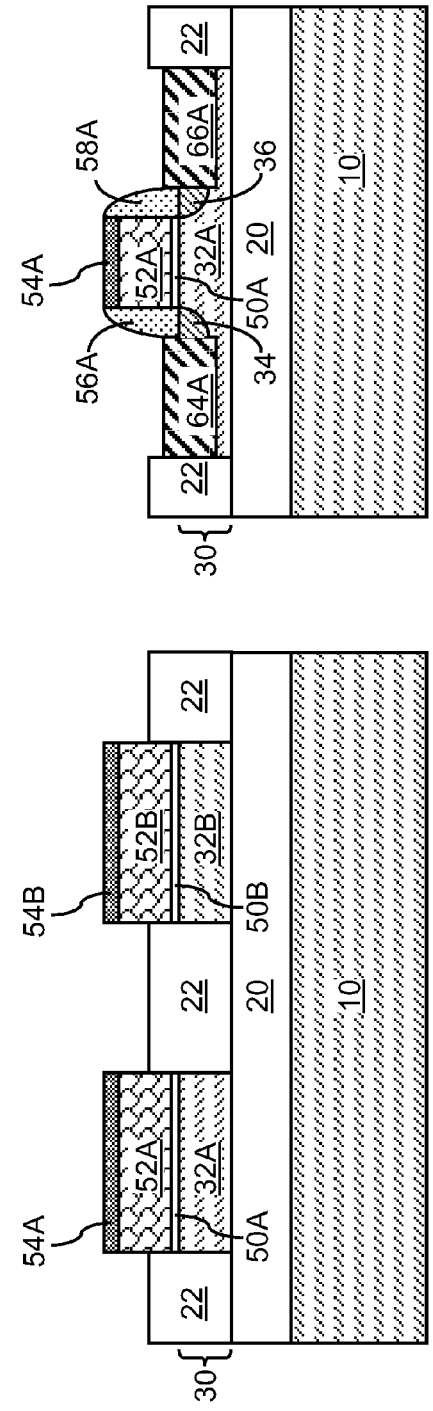

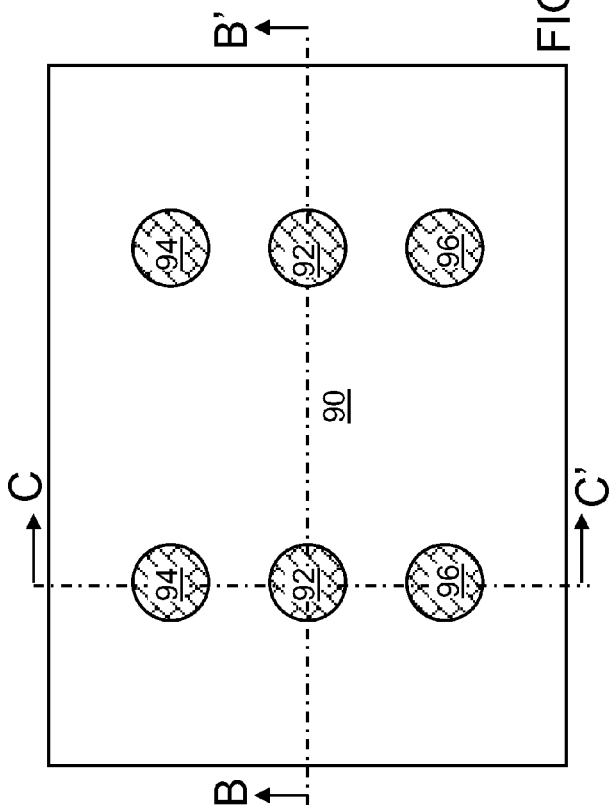
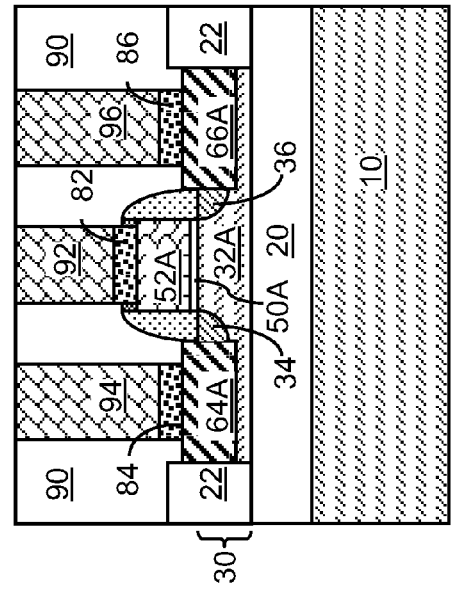
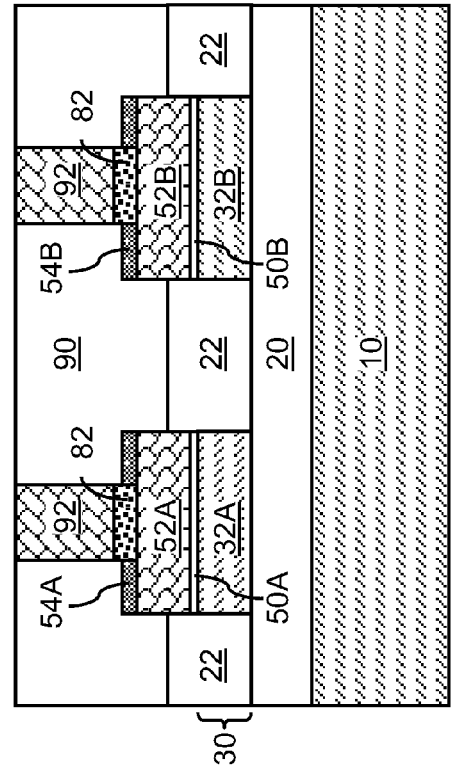
FIG. 25A
FIG. 25B
FIG. 25C

POST-GATE SHALLOW TRENCH ISOLATION STRUCTURE FORMATION

CROSS REFERENCE TO RELATED APPLICATION

This application is a divisional of U.S. patent application Ser. No. 13/277,259, filed on Oct. 20, 2011, the entire content and disclosure of which are incorporated herein by reference.

BACKGROUND

The present disclosure relates to methods of forming semiconductor structures, and particularly to methods of forming a shallow trench isolation structure on a semiconductor substrate after formation of gate stacks, and structures formed by the same.

Shallow trench isolation structures are employed to provide lateral electrical isolation among semiconductor devices in a semiconductor substrate. However, methods of forming shallow trench isolation structures as known in the art generate many undesirable effects on device performance and reliability. For example, it has been well known that divots around boundaries of shallow trench isolation structures can expand in preclean or wet etch steps, and subsequently provide a leakage path when a conductive material is deposited therein.

When embedded source and drain regions are formed in a structure including shallow trench isolation structures, additional complications to device performance can arise due to interaction between the embedded source and drain regions and the shallow trench isolation structures. For example, embedded Si:C source and drain regions in an n-type field effect transistor (NFET) can increase the on-current of the NFET, but facets are formed at the interface between the embedded Si:C source and drain regions and the shallow trench isolation structures. Similar facets are also formed between embedded silicon-germanium alloy source and drain regions in a p-type field effect transistor (PFET) and the shallow trench isolation regions in contact with the embedded silicon-germanium alloy source and drain regions.

Such facets introduce strong variability of the device threshold voltage as well as increased variability of the device threshold voltage as a function of the width of the device because of stress loss and additional threshold voltage-width effect. In addition, the facets also cause gate lines to develop a significant topography, resulting in wavy vertical gate stack profiles.

In addition, the methods of forming shallow trench isolation structures as known in the art introduces variability in the printed lithographic images for gate lines as a function of the density of underlying shallow trench isolation regions. Further, since the shallow trench isolation structures are subjected to subsequent thermal anneals including dopant activation anneals performed at temperatures greater than 700° C., dopants diffuse to the boundaries of the shallow trench isolation structures and increase leakage current between neighboring devices.

The above discussed phenomena adversely impacts performance of devices laterally isolated by shallow trench isolation structures as known in the art.

SUMMARY

Doped wells, gate stacks, and embedded source and drain regions are formed on, or in, a semiconductor substrate, followed by formation of shallow trenches in the semiconductor substrate. The shallow trenches can be formed by forming a planarized material layer over the doped wells, the gate stacks, and the embedded source and drain regions; patterning the planarized material layer; and transferring the pattern in the planarized material layer into the gate stacks, embedded source and drain regions, and the doped wells. The shallow trenches are filled with a dielectric material to form shallow trench isolation structures. The planarized material layer may remain over the underlying structures, or may be removed. Alternately, the shallow trenches can be formed by applying a photoresist over the doped wells, the gate stacks, and the embedded source and drain regions, and subsequently etching exposed portions of the underlying structures. After removal of the photoresist, shallow trench isolation structures can be formed by filling the shallow trenches.

According to an aspect of the present disclosure, a method of forming a semiconductor structure includes: forming a gate stack including a gate dielectric and a gate electrode on a semiconductor substrate; forming a trench laterally surrounding a contiguous set of at least one semiconductor portion in the semiconductor substrate after forming the gate stack; and filling the trench with a dielectric material. A shallow trench isolation structure including at least a dielectric material portion embedded in the semiconductor substrate and laterally surrounding the contiguous set of the at least one semiconductor portion is formed.

According to another aspect of the present disclosure, a semiconductor structure includes: a gate stack including a gate dielectric and a gate electrode and located on a semiconductor substrate; and a shallow trench isolation structure including a dielectric material and laterally surrounding a contiguous set of at least one semiconductor portion located in the semiconductor substrate, wherein the shallow trench isolation structure is in physical contact with the set of at least one semiconductor portion and a sidewall of the gate electrode.

BRIEF DESCRIPTION OF THE SEVERAL VIEWS OF THE DRAWINGS

Figures having a suffix of "A" after a figure numeral are top-down views. Figures having a suffix "B" after a figure numeral are vertical cross-sectional views along a vertical plane B-B' in the figure with the same figure numeral and a suffix "A." Figures having a suffix "C" after a figure numeral are vertical cross-sectional views along a vertical plane C-C' in the figure with the same figure numeral and a suffix "A." Figures having the same figure numeral correspond to the same stage of a manufacturing process.

FIGS. 1A, 1B, and 1C are various views of a first exemplary semiconductor structure after formation of a first conductivity type well and a second conductivity type well in a top semiconductor layer of a semiconductor-on-insulator (SOI) substrate according to a first embodiment of the present disclosure.

FIGS. 2A, 2B, and 2C are various views of the first exemplary semiconductor structure after formation of a first gate stack over the first conductivity type well and a second gate stack over the second conductivity type well according to the first embodiment of the present disclosure.

FIGS. 3A, 3B, and 3C are various views of the first exemplary semiconductor structure after formation of first source and drain extension regions and second source and drain extension regions according to the first embodiment of the present disclosure.

FIGS. 4A, 4B, and 4C are various views of the first exemplary semiconductor structure after formation of gate spacers according to the first embodiment of the present disclosure.

FIGS. 5A, 5B, and 5C are various views of the first exemplary semiconductor structure after deposition of a first masking layer and lithographic patterning of the first masking layer and formation of a first source trench and a first drain trench by etching exposed portions of the first source and drain extension regions and the first conductivity type well according to the first embodiment of the present disclosure.

FIGS. 6A, 6B, and 6C are various views of the first exemplary semiconductor structure after selective deposition of a first embedded source region and a first embedded drain region according to the first embodiment of the present disclosure.

FIGS. 7A, 7B, and 7C are various views of the first exemplary semiconductor structure after removal of the first masking layer according to the first embodiment of the present disclosure.

FIGS. 8A, 8B, and 8C are various views of the first exemplary semiconductor structure after deposition of a second masking layer and lithographic patterning of the second masking layer and formation of a second source trench and a second drain trench by etching exposed portions of the second source and drain extension regions and the second conductivity type well according to the first embodiment of the present disclosure.

FIGS. 9A, 9B, and 9C are various views of the first exemplary semiconductor structure after selective deposition of a second embedded source region and a second embedded drain region according to the first embodiment of the present disclosure.

FIGS. 12A, 12B, and 12C are various views of the first exemplary semiconductor structure after application and patterning of a photoresist and transfer of the pattern in the photoresist into the planarized material layer according to the first embodiment of the present disclosure.

FIGS. 14A, 14B, and 14C are various views of the first exemplary semiconductor structure after deposition of a dielectric material to form a shallow trench dielectric layer according to the first embodiment of the present disclosure.

FIGS. 15A, 15B, and 15C are various views of the first exemplary semiconductor structure after recessing the shallow trench dielectric layer to form a shallow trench isolation structure according to the first embodiment of the present disclosure.

FIGS. 17A, 17B, and 17C are various views of the first exemplary semiconductor structure after formation of a contact-level dielectric layer, various metal-semiconductor alloy portions, and various contact structures according to the first embodiment of the present disclosure.

FIGS. 18A, 18B, and 18C are various views of a second exemplary semiconductor structure according to a second embodiment of the present disclosure.

FIGS. 21A, 21B, and 21C are various views of a fourth exemplary semiconductor structure according to a fourth embodiment of the present disclosure.

FIGS. 22A, 22B, and 22C are various views of a fifth exemplary semiconductor structure after application of a photoresist and lithographic pattering of the photoresist according to a fifth embodiment of the present disclosure.

FIGS. 23A, 23B, and 23C are various views of the fifth exemplary semiconductor structure after transfer of the pattern in the photoresist down to a top surface of a buried insulator layer according to the fifth embodiment of the present disclosure.

FIGS. 24A, 24B, and 24C are various views of the fifth exemplary semiconductor structure after selective deposition of a shallow trench isolation structure according to the fifth embodiment of the present disclosure.

FIGS. 25A, 25B, and 25C are various views of the fifth exemplary semiconductor structure after formation of a contact-level dielectric layer, various metal-semiconductor alloy portions, and various contact structures according to the fifth embodiment of the present disclosure.

DETAILED DESCRIPTION

Figure 10A:
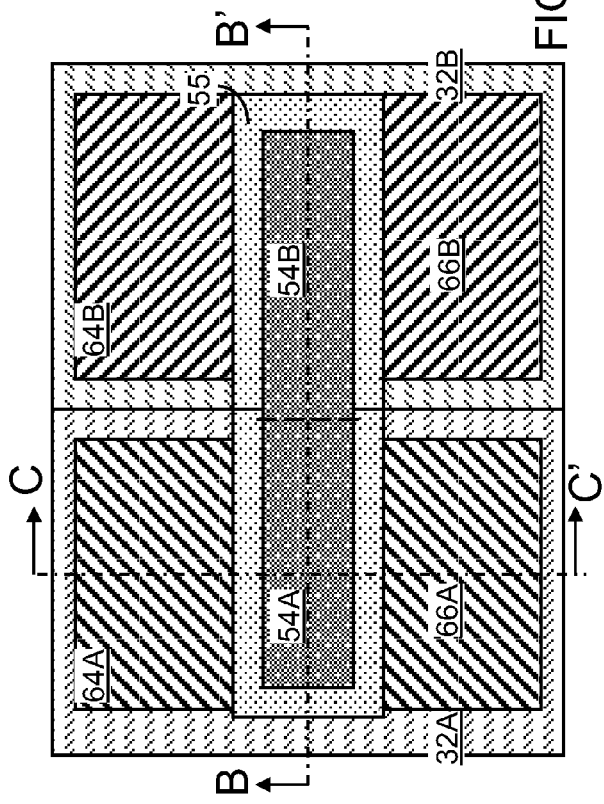
FIGS. 10A, 10B, and 10C are various views of the first exemplary semiconductor structure after removal of the second masking layer according to the first embodiment of the present disclosure.

As stated above, the present disclosure relates to methods of forming a shallow trench isolation structure on a semiconductor substrate after formation of gate stacks, and structures formed by the same, which are now described in detail with accompanying figures. Like and corresponding elements mentioned herein and illustrated in the drawings are referred to by like reference numerals. The drawings are not necessarily drawn to scale.

Referring to FIGS. 1A, 1B, and 1C, a first exemplary semiconductor according to a first embodiment of the present disclosure includes a semiconductor substrate 8. The semiconductor substrate 8 can be a semiconductor-on-insulator (SOI) substrate including a stack of a handle substrate 10, a buried insulator substrate 20, and a top semiconductor layer 30. The handle substrate 10 can include a semiconductor material, an insulator material, a conductive material, or a combination thereof. The handles substrate 10 provides structural support to the semiconductor substrate 8 during mechanical handling. The buried insulator layer 20 includes a dielectric material such as silicon oxide, silicon nitride, silicon oxynitride, or a combination thereof. The thickness of the buried insulator layer 20 can be from 20 nm to 600 nm, although lesser and greater thicknesses can also be employed. The top semiconductor layer 30 includes a semiconductor material such as silicon, a silicon-germanium alloy, a silicon-carbon alloy, a silicon-germanium-carbon alloy, a III-V compound semiconductor material, a II-VI compound semiconductor material, an alloy thereof, or a stack thereof. The thickness of the top semiconductor layer 30 can be from 5 nm to 300 nm, although lesser and greater thicknesses can also be employed.

In one embodiment, the top semiconductor layer 30 includes a single crystalline semiconductor material. The top semiconductor layer 30 can include various portions having a different type of doping (e.g., p-type doping or n-type doping) and/or different dopant concentration levels. The various portions in the semiconductor layer 30 can be formed, for example, by forming and patterning an implantation mask layer on the semiconductor substrate 8 and implanting dopants into openings in the implantation mask layer and into exposed portions of the top semiconductor layer 30. Multiple implantation mask layers and multiple instances of dopant implantation can be employed to provide the various portions in the semiconductor layer 30.

In a non-limiting illustrative example, the various portions in the top semiconductor layer 30 can include a first conductivity type well 32A and a second conductivity type well 32B. The first conductivity type well 32A can include a semiconductor material, such as single crystalline silicon, having a doping of a first conductivity type, which can be p-type or n-type. The second conductivity type well can include the same semiconductor material having a doping of a second conductivity type which is the opposite of the first conductivity type. For example, the first conductivity type can be p-type and the second conductivity type can be n-type, and vice versa. The lattice constant of the semiconductor material in the first conductivity type well 32A and the second conductivity type well 32B is herein referred to as a first lattice constant.

Referring to FIGS. 2A, 2B, and 2C, gate stacks are formed on the top surface of the top semiconductor layer 30. The gate stacks can include, for example, a first gate stack formed over the first conductivity type well 32A and a second gate stack formed over the second conductivity type well 32B. The gate stacks can be formed, for example, by depositing a gate dielectric layer and a gate conductor layer, and optionally a gate cap dielectric layer. The vertical stack of the gate dielectric layer, the gate conductor layer, and the optional gate cap dielectric layer is patterned, for example, by applying a photoresist (not shown) thereupon, lithographically patterning the photoresist, transferring the pattern in the photoresist into the vertical stack, and removing remaining portions of the photoresist.

A remaining portion of the gate dielectric layer overlying the first conductivity type well 32A is a first gate dielectric 50A. A remaining portion of the gate conductor layer overlying the first conductivity type well 32A is a first gate electrode 52A. A remaining portion of the optional gate cap dielectric layer overlying the first conductivity type well 32A is a first gate cap dielectric 54A. The first gate dielectric 50A, the first gate electrode 52A, and the optional first gate cap dielectric 54A collectively constitute a first gate stack (50A, 52A, 54A). A remaining portion of the gate dielectric layer overlying the second conductivity type well 32B is a second gate dielectric 50B. A remaining portion of the gate conductor layer overlying the second conductivity type well 32B is a second gate electrode 52B. A remaining portion of the optional gate cap dielectric layer overlying the second conductivity type well 32B is a second gate cap dielectric 54B. The second gate dielectric 50B, the second gate electrode 52B, and the optional second gate cap dielectric 54B collectively constitute a second gate stack (50B, 52B, 54B).

The first gate dielectric 50A and the second gate dielectric 50B can include any dielectric material that can be employed in a gate dielectric as known in the art. The first gate electrode 52A and the second gate electrode 52B can include any conductive material that can be employed in a gate electrode as known in the art.

The first gate stack (50A, 52A, 54A) and the second gate stack (50B, 52B, 54B) can be laterally adjoined to each other and form a single contiguous structure, or can be laterally spaced from each other, i.e., formed as two different disjoined structures. The first gate dielectric 50A and the second gate dielectric 50B can be formed simultaneously and have the same composition, or can be formed at different processing steps and have different compositions. The first gate electrode 52A and the second gate electrode 52 can be formed simultaneously and have the same composition, or can be formed at different processing steps and have different compositions.

Referring to FIGS. 3A, 3B, and 3C, various source and drain extension regions can be optionally formed, for example, by applying and patterning an implantation mask layer (not shown), which can be a photoresist, and implanting dopants into openings in the implantation mask layer. Source and drain extension regions collective refer to source extension regions and drain extension regions as known in the art. Multiple implantation mask layers and multiple ion implantation steps can be employed to form various source and drain extension regions having different conductivity types and/or different dopant concentration.

For example, dopants of the second conductivity type can be implanted in surface portions of the first conductivity type well 32A to form a first source extension region 34 and a first drain extension region 36. The first source extension region 34 is located on one side of a vertical plane (e.g., the plane of B-B') passing through the center of the first gate stack (50A, 52A, 54A), and the first drain extension region 36 can be located on the other side of the vertical plane passing through the center of the first gate stack (50A, 52A, 54A). Likewise, dopants of the first conductivity type can be implanted in surface portions of the second conductivity type well 32B to form a second source extension region 34' and a second drain extension region 36'. The second source extension region 34 is located on one side of a vertical plane (e.g., the plane of B-B') passing through the center of the second gate stack (50B, 52B, 54B), and the second drain extension region 36 can be located on the other side of the vertical plane passing through the center of the second gate stack (50B, 52B, 54B).

Referring to FIGS. 4A, 4B, and 4C, gate spacers are formed on the sidewalls of each gate stack. Specifically, a gate spacer 55 can be formed on the sidewalls of the first gate stack (50A, 52A, 54A) and the second gate stack (50B, 52B, 54B) such that the gate spacer 55 contiguously surrounds the combination of the first gate stack (50A, 52A, 54A) and the second gate stack (50B, 52B, 54B) laterally. The entirety of the gate spacer 55 is contiguous, and the gate spacer 55 can be topologically homeomorphic to a torus having a single hole.

The gate spacer 55 can be formed, for example, by depositing a conformal dielectric layer and anisotropically etching horizontal portions of the conformal dielectric layer. Remaining portions of the conformal dielectric layer constitute the gate spacer 55.

Referring to FIGS. 5A, 5B, and 5C, a first masking layer 45 can be deposited and lithographically patterned to form openings within the area of the first conductivity type well 32A, while covering the entire area of the second conductivity type well 32B. The first masking layer 45 can include a dielectric material such as silicon oxide, silicon nitride, and/or silicon oxynitride. The first masking layer 45 can be deposited by a conformal deposition method such as chemical vapor deposition (CVD). The thickness of the first masking layer 45 can be from 3 nm to 20 nm, although lesser and greater thicknesses can also be employed. The first masking layer 45 can be patterned by applying a first photoresist 49 and lithographically patterning the first photoresist 49 by lithographic exposure and development.

A first source trench 63A and a first drain trench 65A are formed by anisotropically etching the semiconductor material of the first conductivity type well 32A within the opening in the first masking layer 45. The first source trench 63A and the first drain trench 65A can have the same depth, which is less than the thickness of the top semiconductor layer 30. Thus, a semiconductor surface of the first conductivity type well 32A is exposed at each bottom surface of the first source trench 63A and the first drain trench 65A. Each of the first source trench 63A and the first drain trench 65A can have a horizontal bottom surface and vertical sidewall surfaces.

The first gate stack (50A, 52A, 54A) and the gate spacer 55 prevent etching of the underlying semiconductor material during the anisotropic etch. Thus, a sidewall of the first source trench 63A is vertically coincident with, i.e., coincide in a top down view of FIG. 5, an outer sidewall of a source-side portion of the gate spacer 55. Likewise, a sidewall of the first drain trench 65A is vertically coincident with an outer sidewall of a drain-side portion of the gate spacer 55.

In one embodiment, the photoresist 49 is patterned such that the vertical edges of the photoresist 49 do not intersect the first gate stack (50A, 52A, 54A) after the lithographic patterning. The vertical edges of the photoresist 49 can overlie end portions of the gate spacer 55. Alternatively, the entirety of the outer surfaces of the gate spacer 55 can be physically exposed within the opening in the photoresist 49, and the entirety of the vertical edges of the photoresist 49 at the periphery of the opening over the first conductivity type well 32A can physically contact a semiconductor surface of the first conductivity type well 32A.

The photoresist 49 is subsequently removed, for example, by ashing.

Referring to FIGS. 6A, 6B, and 6C, a first embedded source region 64A and a first embedded drain region 66A are deposited, for example, by a selective epitaxy of a semiconductor material that is different from the semiconductor material of the first conductivity type well 32A. The first embedded source region 64A and the first embedded drain region 66A can be epitaxially aligned to a crystal structure of the first conductivity type well 32A. The first embedded source region 64A and the first embedded drain region 66A can have a second lattice constant, which is different from the first lattice constant of the single crystalline semiconductor material of the first conductivity type well 32A.

In one embodiment, the semiconductor material of the first conductivity type well 32A can be single crystalline silicon that is doped with dopants of the first conductivity type, and the semiconductor material of the first embedded source region 64A and the first embedded drain region 66A can be a single crystalline silicon-germanium alloy or a single crystalline silicon-carbon alloy having a doping of the second conductivity type. The semiconductor material of the of the first embedded source region 64A and the first embedded drain region 66A can be deposited with in-situ doping of dopants of the second conductivity type, or can be deposited as an intrinsic semiconductor material and is subsequently doped with dopants of the second conductivity type by masked ion implantation.

Because a shallow trench isolation region is not present within the first exemplary semiconductor structure at this step, faceting of the top surfaces of the first embedded source region 64A and the first embedded drain region 66A can be minimized. Thus, a predominant portion of the first embedded source region 64A and the first embedded drain region 66A has a planar top surface.

Referring to FIGS. 7A, 7B, and 7C, the first masking layer 45 is subsequently removed, for example, by a wet etch.

Referring to FIGS. 8A, 8B, and 8C, a second masking layer 43 can be deposited and lithographically patterned to form openings within the area of the second conductivity type well 32B, while covering the entire area of the first conductivity type well 32A. The second masking layer 43 can include a dielectric material such as silicon oxide, silicon nitride, and/or silicon oxynitride. The second masking layer 43 can be deposited by a conformal deposition method such as chemical vapor deposition (CVD). The thickness of the second masking layer 43 can be from 3 nm to 20 nm, although lesser and greater thicknesses can also be employed. The second masking layer 43 can be patterned by applying a second photoresist 47 and lithographically patterning the second photoresist 47 by lithographic exposure and development.

A second source trench 63B and a second drain trench 65B are formed by anisotropically etching the semiconductor material of the second conductivity type well 32B within the opening in the second masking layer 43. The second source trench 63B and the second drain trench 65B can have the same depth, which is less than the thickness of the top semiconductor layer 30. Thus, a semiconductor surface of the second conductivity type well 32B is exposed at each bottom surface of the second source trench 63B and the second drain trench 65B. Each of the second source trench 63B and the second drain trench 65B can have a horizontal bottom surface and vertical sidewall surfaces.

The second gate stack (50B, 52B, 54B) and the gate spacer 55 prevent etching of the underlying semiconductor material during the anisotropic etch. Thus, a sidewall of the second source trench 63B is vertically coincident with an outer sidewall of a source-side portion of the gate spacer 55. Likewise, a sidewall of the second drain trench 65B is vertically coincident with an outer sidewall of a drain-side portion of the gate spacer 55.

In one embodiment, the photoresist 47 is patterned such that the vertical edges of the photoresist 47 do not intersect the second gate stack (50B, 52B, 54B) after the lithographic patterning. The vertical edges of the photoresist 47 can overlie end portions of the gate spacer 55. Alternatively, the entirety of the outer surfaces of the gate spacer 55 can be physically exposed within the opening in the photoresist 47, and the entirety of the vertical edges of the photoresist 47 at the periphery of the opening over the second conductivity type well 32B can physically contact a semiconductor surface of the second conductivity type well 32B.

The photoresist 47 is subsequently removed, for example, by ashing.

Referring to FIGS. 9A, 9B, and 9C, a second embedded source region 64B and a second embedded drain region 66B are deposited, for example, by a selective epitaxy of a semiconductor material that is different from the semiconductor material of the second conductivity type well 32B. The second embedded source region 64B and the second embedded drain region 66B can be epitaxially aligned to a crystal structure of the second conductivity type well 32B. The second embedded source region 64B and the second embedded drain region 66B can have a third lattice constant, which is different from the first lattice constant of the single crystalline semiconductor material of the second conductivity type well 32B, and from the second lattice constant of the single crystalline semiconductor material of the first embedded source region 64A and the first embedded drain region 66A.

In one embodiment, the semiconductor material of the second conductivity type well 32B can be single crystalline silicon that is doped with dopants of the second conductivity type, and the semiconductor material of the second embedded source region 64B and the second embedded drain region 66B can be a single crystalline silicon-germanium alloy or a single crystalline silicon-carbon alloy having a doping of the first conductivity type.

In one embodiment, the semiconductor material of the first conductivity type well 32A can be single crystalline silicon that is doped with dopants of the first conductivity type, the semiconductor material of the second conductivity type well 32B can be single crystalline silicon that is doped with dopants of the second conductivity type, the semiconductor material of the first embedded source region 64A and the first embedded drain region 66A can be one of a single crystalline silicon-germanium alloy or a single crystalline silicon-carbon alloy having a doping of the second conductivity type, and the semiconductor material of the second embedded source region 64B and the second embedded drain region 66B can be the other of a single crystalline silicon-germanium alloy or a single crystalline silicon-carbon alloy having a doping of the first conductivity type.

The semiconductor material of the of the second embedded source region 64B and the second embedded drain region 66B can be deposited with in-situ doping of dopants of the first conductivity type, or can be deposited as an intrinsic semiconductor material and is subsequently doped with dopants of the first conductivity type by masked ion implantation.

Because a shallow trench isolation region is not present within the first exemplary semiconductor structure at this step, faceting of the top surfaces of the second embedded source region 64B and the second embedded drain region 66B can be minimized. Thus, a predominant portion of the second embedded source region 64B and the second embedded drain region 66B has a planar top surface.

Figure 10C:
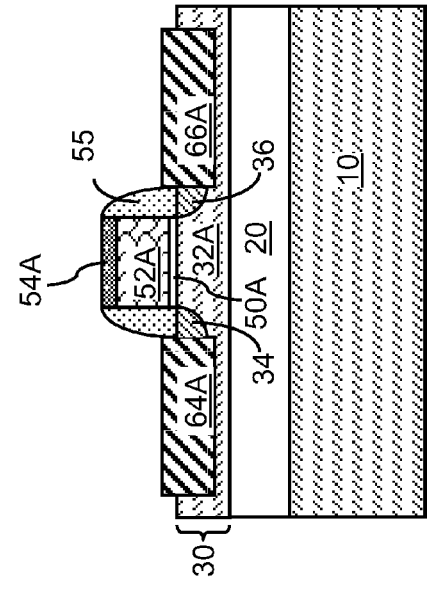
Figure 10B:
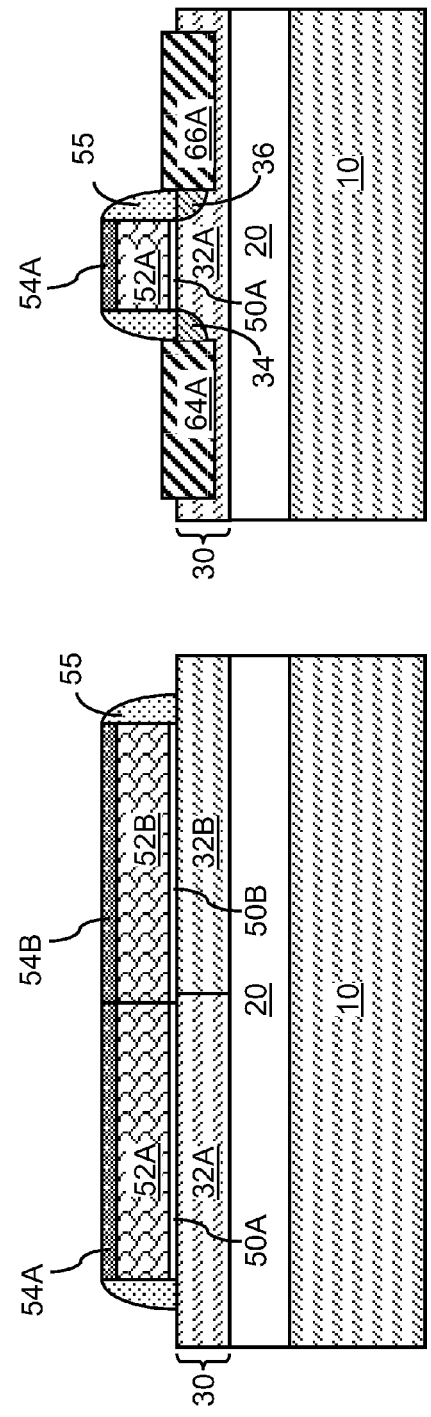

Referring to FIGS. 10A, 10B, and 10C, the second masking layer 43 is subsequently removed, for example, by a wet etch.

Figure 11A:
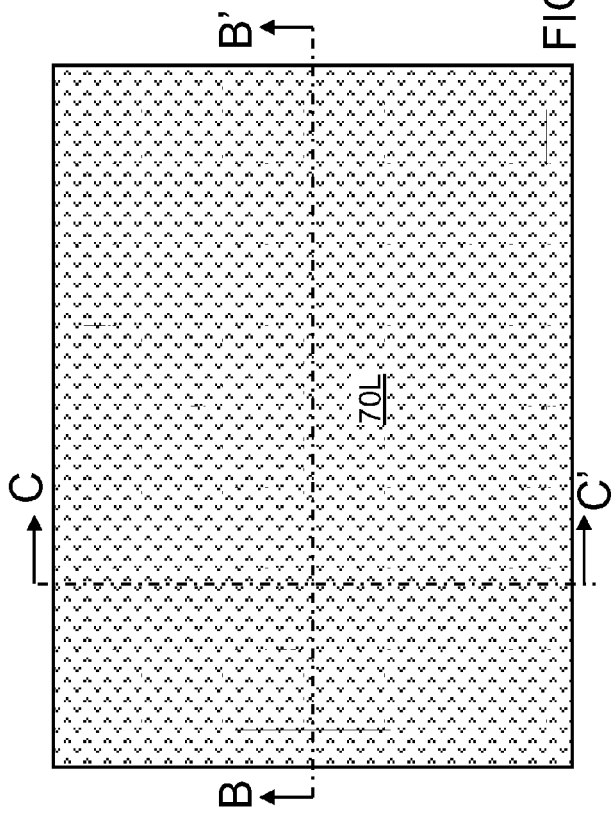
FIGS. 11A, 11B, and 11C are various views of the first exemplary semiconductor structure after deposition of a planarized material layer according to the first embodiment of the present disclosure.
Figure 11C:
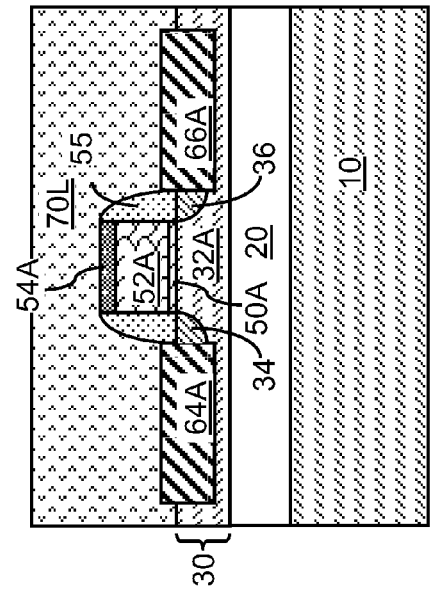
Figure 11B:
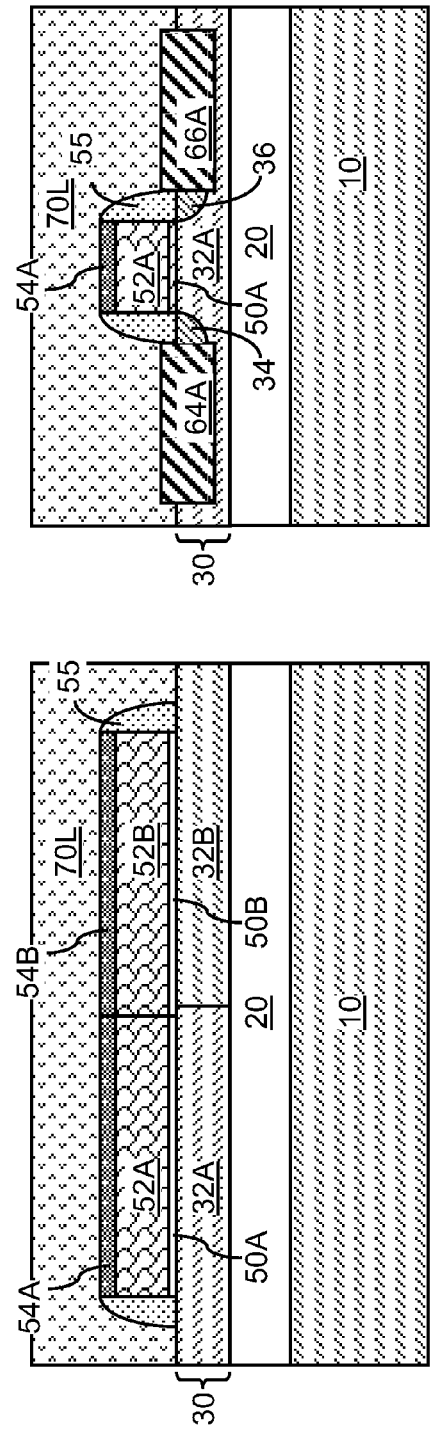

Referring to FIGS. 11A, 11B, and 11C, a planarized material layer 70L is deposited over the semiconductor substrate 8, the first gate stack (50A, 52A, 54A), the second gate stack (50B, 52B, 54B), and the gate spacer 55. The planarized material layer 70L can include a self-planarizing material such as spin-on glass (SOG). Alternatively, the planarized material layer 70L can include a non-self-planarizing material that can be deposited by chemical vapor deposition (CVD), atomic layer deposition (ALD), physical vapor deposition (PVD), or any other deposition method that deposits a material in a non-self-planarizing manner.

In one embodiment, the planarized material layer 70L includes a material that is different from the semiconductor material of the first embedded source region 64A, the first embedded drain region 66A, the second embedded source region 64B, and the second embedded drain region 66B, and different from the dielectric material of the gate spacer 55.

In one embodiment, the planarized material layer 70L includes a material that can be removed selective to the materials of the first embedded source region 64A, the first embedded drain region 66A, the second embedded source region 64B, the second embedded drain region 66B, the gate spacer 55, and at least one of the gate cap dielectrics (54A, 54B) and a top portion of the gate electrodes (52A, 52B).

For example, the planarized material layer 70L can include a semiconductor material such as germanium or a silicon germanium alloy having a germanium concentration greater than 50% in atomic percentage. Alternately, the planarized material layer 70L can include organosilicate glass (OSG). Yet alternately, the planarized material layer 70L can include silicon oxide, and the gate spacer 55, and the gate cap dielectrics (54A, 54B) can include silicon nitride.

The thickness of the planarized material layer 70L, as measured from above the topmost surfaces of the gate stacks (50A, 52A, 54A, 50B, 52B, 54B) can be from 30 nm to 600 nm, although lesser and greater thicknesses can also be employed.

Referring to FIGS. 12A, 12B, and 12C, a photoresist 77 is applied over the planarized material layer 70L, and is lithographically patterned to form a first photoresist portion 77A overlying the first conductivity type well 32A and a second photoresist portion 77B overlying the second conductivity type well 32B. The first photoresist portion 77A of the photoresist 77 can include a pair of vertical sidewalls such that two vertical planes containing the two vertical sidewalls intersect the first gate stack (50A, 52A, 54A). The two vertical planes containing the two vertical sidewalls of the first photoresist portion 77A can be more proximal to a center of mass of the first gate electrode 52A than a pair of sidewalls of the first gate stack (50A, 52A, 54A) that are parallel to the two vertical planes Likewise, the second photoresist portion of the the photoresist 77 can include a pair of vertical sidewalls such that two vertical planes containing the two vertical sidewalls intersect the second gate stack (50B, 52B, 54B). The two vertical planes containing the two vertical sidewalls of the second photoresist portion 77B can be more proximal to a center of mass of the second gate electrode 52B than a pair of sidewalls of the second gate stack (50B, 52B, 54B) that are parallel to the two vertical planes.

In one embodiment, the sidewalls of the first photoresist portion 77A can be laterally offset inward from a periphery of a combined area of the first embedded source region 64A, the first embedded drain region 66A, the first gate stack (50A, 52A, 54A), and the gate spacer 55 as seen in a top-down view, i.e., the view of FIG. 12A. Likewise, the sidewalls of the second photoresist portion 77B can be laterally offset inward from a periphery of a combined area of the second embedded source region 64B, the second embedded drain region 66B, the second gate stack (50B, 52B, 54B), and the gate spacer 55 as seen in the top-down view, i.e., the view of FIG. 12A.

In one embodiment, the lateral offsets of the sidewalls of the first photoresist portion 77A and the sidewalls of the second photoresist portion 77B can be set such that the sidewalls of the first photoresist portion 77A and the sidewalls of the second photoresist portion 77B contact horizontal planar surfaces of the first embedded source region 64A, the first embedded drain region 66A, the second embedded source region 64B, and the second embedded drain region 66B, and does not contact faceted surfaces of the first embedded source region 64A, the first embedded drain region 66A, the second embedded source region 64B, and the second embedded drain region 66B that are at a non-zero angle relative to a horizontal surface.

Figure 13A:
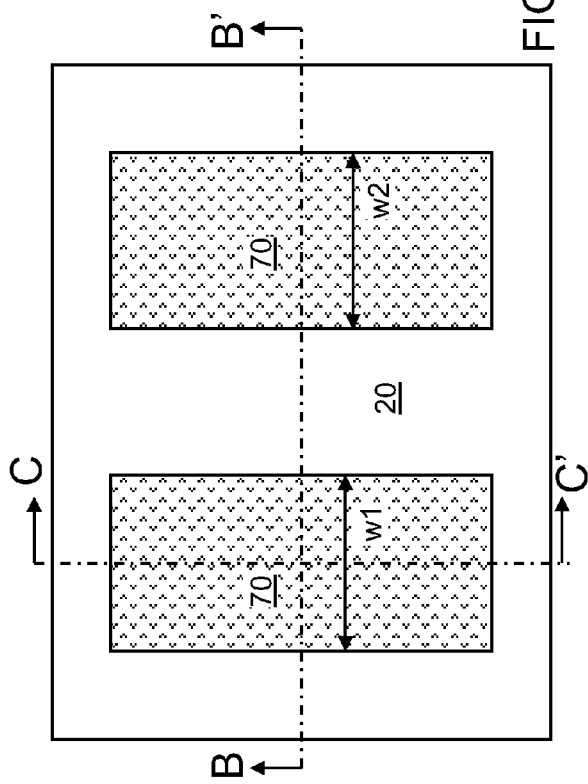
FIGS. 13A, 13B, and 13C are various views of the first exemplary semiconductor structure after transfer of the pattern in the planarized material layer down to the top surface of a buried insulator layer by an anisotropic etch and formation of a shallow trench according to the first embodiment of the present disclosure.
Figure 13C:
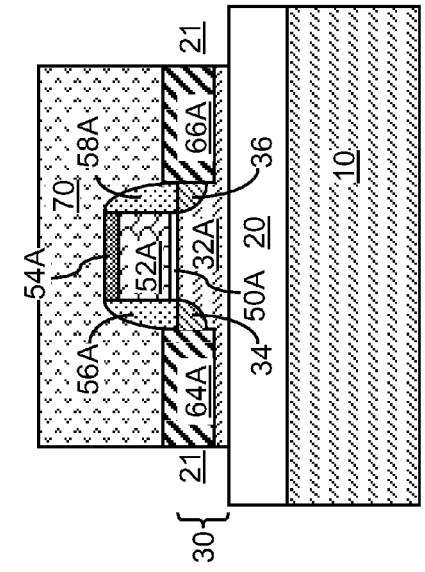
Figure 13B:
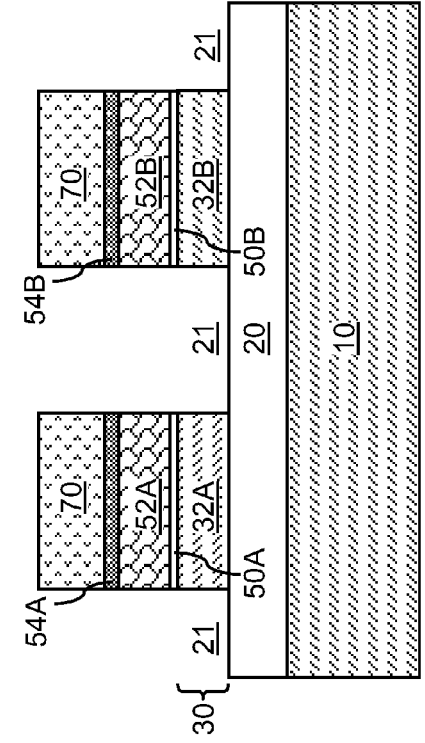

Referring to FIGS. 13A, 13B, and 13C, the pattern in the photoresist 77 is transferred into the planarized material layer 70L, for example, by an anisotropic etch. The planarized material layer 70L is patterned to form planarized material portions 70. The pattern in the planarized material portions 70 is transferred into the combined structure of the first and second gate stacks (50A, 52A, 54A, 50B, 52B, 54B), the gate spacer 55, and the semiconductor materials within the top semiconductor layer 30. The pattern in the planarized material layer 70 can be transferred down to the top surface of the buried insulator layer by an anisotropic etch. The photoresist 77 may, or may not, be present over the planarized material portions 70 during the transfer of the pattern in the planarized material portions 70 into the top semiconductor layer 30. In other words, the photoresist 77 or the planarized material portions 70 can function as an etch mask during the anisotropic etch that transfers the pattern in the planarized material portions into the top semiconductor layer 30.

During the pattern transfer into the first and second gate stacks (50A, 52A, 54A, 50B, 52B, 54B), the gate spacer 55, end portions of the first gate electrode 52A and the second gate electrode 52B can be removed by an anisotropic etch. Two sidewalls of the first gate electrode 52A can become physically exposed during the anisotropic etch Likewise, two sidewalls of the second gate electrode 52B can become physically exposed during the isotropic etch.

The gate spacer 55 becomes physically divided into four portions. Specifically, the gate spacer 55 is divided, during the anisotropic etch, into a first source-side gate spacer 56A located on one side (i.e., a source side) of a remaining portion of the first gate electrode 52A, a first drain-side gate spacer 58A located on an opposite side (i.e., a drain side) of the remaining portion of the first gate electrode 52A, a second source-side gate spacer 56B located on one side (i.e., a source side) of a remaining portion of the second gate electrode 52B, and a second drain-side gate spacer 58B located on an opposite side (i.e., a drain side) of the remaining portion of the second gate electrode 52B. The first source-side gate spacer 56A is not contiguous with the first drain-side gate spacer 58A, and is laterally offset from the first drain-side gate spacer 58A by the width of the first gate electrode 52A. The second source-side gate spacer 56B is not contiguous with the second drain-side gate spacer 58B, and is laterally offset from the second drain-side gate spacer 58B by the width of the second gate electrode 52B. The first source-side gate spacer 56A and the first drain-side gate spacer 58A are laterally offset from the second source-side gate spacer 56B and the second drain-side gate spacer 58B.

The pattern transfer further proceeds into underlying structures, i.e., into the top semiconductor layer 30 until the top surface of the buried insulator layer 20 is physically exposed in areas not covered by the planarized material portions 70. A shallow trench 21 laterally surrounds a first contiguous set of semiconductor portions and a second contiguous set of semiconductor portions that are located within the top semiconductor layer 30. The first contiguous set of semiconductor portions includes a remaining portion of the first conductivity type well 32A, a remaining portion of the first embedded source region 64A, and a remaining portion of the first embedded drain region 66A. The entirety of the first contiguous set of semiconductor portions (32A, 64A, 66A) can be single crystalline. The second contiguous set of semiconductor portions includes a remaining portion of the second conductivity type well 32B, a remaining portion of the second embedded source region 64B, and a remaining portion of the second embedded drain region 66B. The entirety of the second contiguous set of semiconductor portions (32B, 64B, 66B) can be single crystalline. Any remaining portion of the photoresist 77 is subsequently removed, for example, by ashing.

A pair of physically exposed sidewalls of the first gate stack (50A, 52A, 54A) is vertically coincident with a pair of sidewalls of an overlying planarized material portion 70 and with a pair of sidewalls of the first contiguous set of semiconductor portions (32A, 64A, 66A). In one embodiment, the pair of physically exposed sidewalls of the first gate stack (50A, 52A, 54A) can be parallel to each other, and the first gate stack (50A, 52A, 54A), an overlying planarized material portion 70, and the first contiguous set of semiconductor portions (32A, 64A, 66A) can have the same width, which is herein referred to as a first width w1.

A pair of physically exposed sidewalls of the second gate stack (50B, 52B, 54B) is vertically coincident with a pair of sidewalls of an overlying planarized material portion 70 and with a pair of sidewalls of the second contiguous set of semiconductor portions (32B, 64B, 66B). In one embodiment, the pair of physically exposed sidewalls of the second gate stack (50B, 52B, 54B) can be parallel to each other, and the second gate stack (50B, 52B, 54B), an overlying planarized material portion 70, and the second contiguous set of semiconductor portions (32B, 64B, 66B) can have the same width, which is herein referred to as a second width w2.

In one embodiment, the sidewalls of the planarized material portions 70 can be located to overlie planar horizontal surfaces of, and do not overlie faceted surfaces of, the first embedded source region 64A, the first embedded drain region 66A, the second embedded source region 64B, and the second embedded drain region 66B. In this embodiment, the entirety of the interface between the planarized material portions 70 and each of the first embedded source region 64A, the first embedded drain region 66A, the second embedded source region 64B, and the second embedded drain region 66B can be horizontal surfaces.

Referring to FIGS. 14A, 14B, and 14C, a dielectric material is deposited within the shallow trench 21 and over the planarized material portions 70 to form a shallow trench dielectric layer 22L. The dielectric material of the shallow trench dielectric layer 22L is different from the material of the planarized material portions 70. The dielectric material of the shallow trench dielectric layer 22L can include, for example, silicon oxide, silicon nitride, silicon oxynitride, a dielectric metal oxide having a dielectric constant greater than 8.0 (i.e., a "high-k" dielectric material), organosilicate glass (OSG), and/or other dielectric materials that can be employed in metal interconnect structures as known in the art. The shallow trench dielectric layer 22L can be deposited by a self-planarizing deposition process such as spin coating, or can be deposited by a non-self-planarizing deposition process such as chemical vapor deposition (CVD).

Referring to FIGS. 15A, 15B, and 15C, the shallow trench dielectric layer 22L can be optionally planarized, for example, employing the planarized material portions 70 as a stopping layer. The optional planarization of the shallow trench dielectric layer 22L can be effected, for example, by chemical mechanical planarization (CMP), a recess etch, or a combination thereof.

The shallow trench dielectric layer 22L is recessed below the top surfaces of the planarized material layer 22L. At the end of the recessing, the top surface of the shallow trench dielectric layer 22L can be located at the level of, below, or above, the interface between the gate dielectrics (50A, 50B) and the first and second conductivity type wells (32A, 32B). The remaining portion of the shallow trench dielectric layer 22L is a shallow trench isolation structure 22 that laterally surrounds, and contacts, each of the first contiguous set of semiconductor portions (32A, 64A, 66A) and the second contiguous set of semiconductor portions (32B, 64B, 66B).

In one embodiment, the entirety of the interface between the planarized material portions 70 and each of the first embedded source region 64A, the first embedded drain region 66A, the second embedded source region 64B, and the second embedded drain region 66B can be horizontal. The horizontal top surfaces of the first contiguous set of semiconductor portions (32A, 64A, 66A) and the second contiguous set of semiconductor portions (32B, 64B, 66B) can contact sidewalls of the shallow trench isolation structure 22 at right angle throughout an entirety of a periphery of the top horizontal surface that is in contact with the shallow trench isolation structure 22.

Figure 16C:
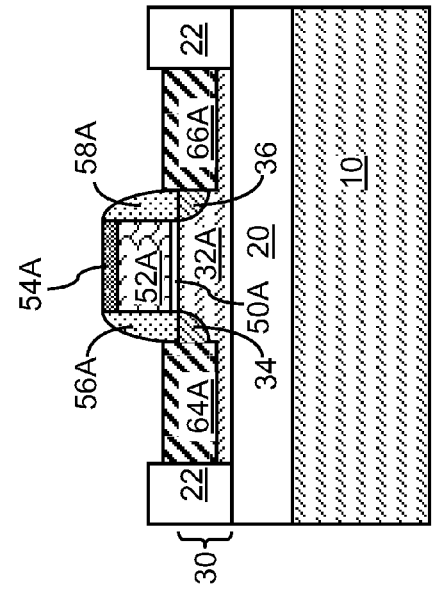
FIGS. 16A, 16B, and 16C are various views of the first exemplary semiconductor structure after removal of planarized material portions according to the first embodiment of the present disclosure.
Figure 16A:
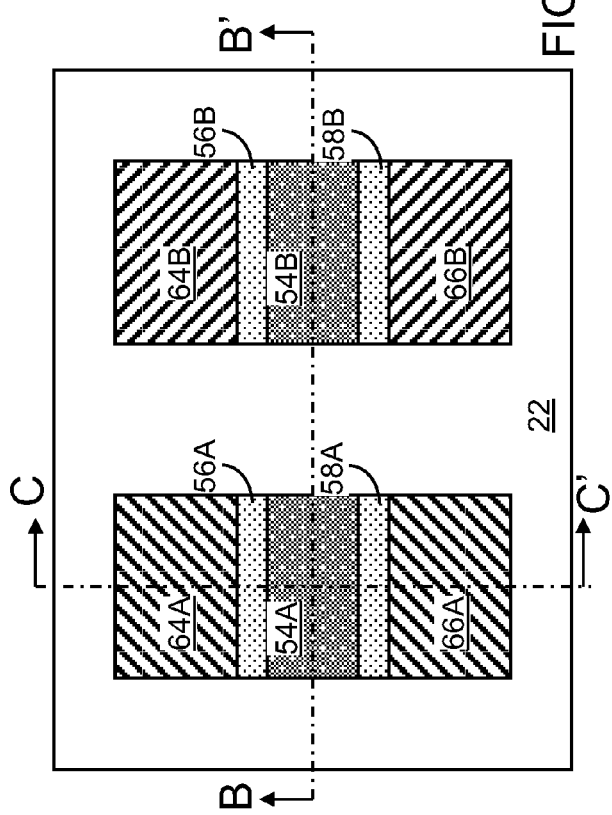
Figure 16B:
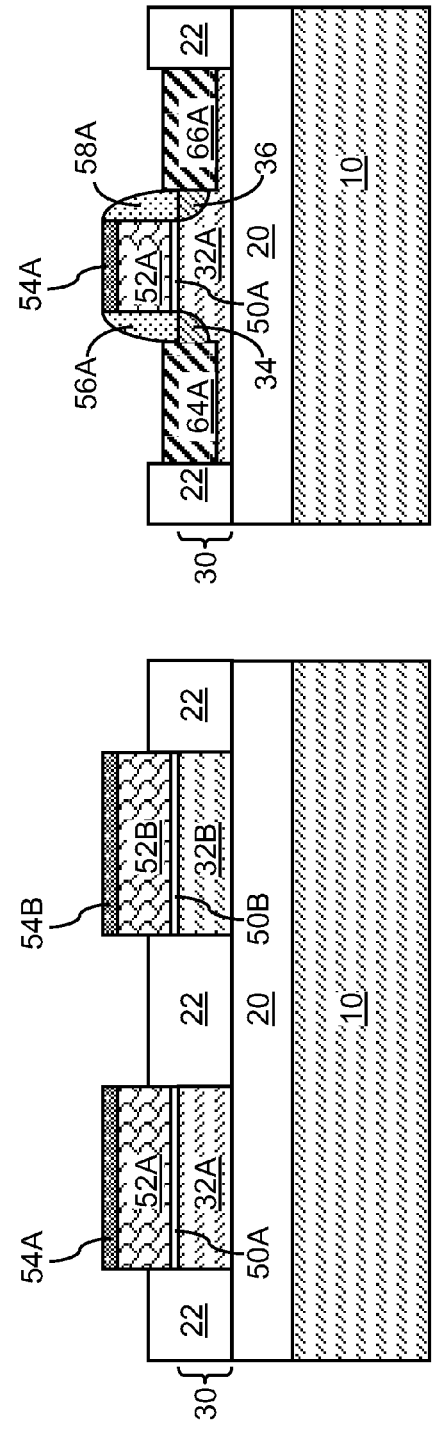

Referring to FIGS. 16A, 16B, and 16C, the planarized material portions 70 are removed selective to the dielectric material of the shallow trench isolation structure 22, selective to the semiconductor materials of the first embedded source region 64A, the first embedded drain region 66A, the second embedded source region 64B, and the second embedded drain region 66B, and selective to at least one of the gate cap dielectrics (54A, 54B) and a topmost portion of the gate electrodes (52A, 52B).

If the top surface of the shallow trench isolations structure 22 is located above the interface between the gate dielectrics (50A, 50B) and the gate electrodes (52A, 52B), sidewalls of the shallow trench isolation structure 22 can be in physical contact with sidewalls of the gate electrodes (52A, 52B). The interfaces between the shallow trench isolation structure 22 and the gate electrodes (52A, 52B) can be vertical.

Referring to FIGS. 17A, 17B, and 17C, a contact-level dielectric layer 90 including a dielectric material is formed over the shallow trench isolation structure 22. Various contact via holes are formed through the contact-level dielectric layer 90 and through the optional gate cap dielectrics (54A, 54B). Various metal-semiconductor alloy portions can be formed on physically exposed semiconductor surfaces at the bottom of the various contact via structures. The various metal-semiconductor alloy portions can include, for example, source-side metal semiconductor alloy portions 84, drain-side metal semiconductor alloy portions 86, and gate-side metal semiconductor alloy portions 82. Various contact structures are formed by filling the various contact via holes with a conductive material. The various contact structures can include, for example, source-side contact structures 94, drain-side contact structures 96, and gate-side contact structures 92.

Because the shallow trench isolation structure 22 is formed after formation of gate stacks (50A, 52A, 54A, 50B, 52B, 54B), the first embedded source region 64A, the first embedded drain region 66A, the second embedded source region 64B, and the second embedded drain region 66B, divot formation at the periphery of the shallow trench isolation structure 22 is minimized, and the physical exposure of the surfaces of the shallow trench isolation structure 22 to wet etches or precleans is minimized. Thus, divots are not present at the periphery of the top surface of the shallow trench isolations structure 22, or the size of any divot present at the periphery of the top surface of the shallow trench isolations structure 22 is negligible compared to divots present in conventional shallow trench isolation structures.

Further, sidewalls of the gate electrodes (52A, 52B) vertically coincide with sidewalls of the first contiguous set of semiconductor portions (32A, 64A, 66A) and the second contiguous set of semiconductor portions (32B, 64B, 66B), the gate electrodes (52A, 52B) do not pass over any boundary between the shallow trench isolation structure 22 and the first contiguous set of semiconductor portions (32A, 64A, 66A) and the second contiguous set of semiconductor portions (32B, 64B, 66B). Thus, unintentional electrical short of the gate electrodes (52A, 52B) is minimized in the first exemplary semiconductor structure.

While the first exemplary semiconductor structure includes the first embedded source region 64A, the first embedded drain region 66A, the second embedded source region 64B, and the second embedded drain region 66B, embodiments can also be employed in which formation of the first embedded source region 64A and the first embedded drain region 66A as illustrated in FIGS. 5A-7C is replaced with formation of a source region and a drain region by implanting dopants of the second conductivity type into portions of the first conductivity type well 32A that are not masked by the first gate stack (50A, 52A, 54A) and the gate spacer 55 without forming a first source trench 63A or a first drain trench 65B. Further, embodiments can also be employed in which formation of the second embedded source region 64B and the second embedded drain region 66B as illustrated in FIGS. 8A-10C is replaced with formation of a source region and a drain region by implanting dopants of the first conductivity type into portions of the second conductivity type well 32B that are not masked by the second gate stack (50B, 52B, 54B) and the gate spacer 55 without forming a second source trench 63B or a second drain trench 65B.

Referring to FIGS. 18A, 18B, and 18C, a second exemplary semiconductor structure according to a second embodiment of the present disclosure can be derived from the first exemplary semiconductor structure by substituting a bulk semiconductor substrate instead of an SOI substrate. In the second exemplary semiconductor structure, the first conductivity type well 32A and the second conductivity type well 32B can be formed within the upper portion of the bulk semiconductor substrate. The portion of the bulk semiconductor substrate below the first conductivity type well 32A and the second conductivity type well 32B can be a single crystalline semiconductor portion 10' that is in epitaxial alignment with the first conductivity type well 32A and the second conductivity type well 32B.

Figure 19A:
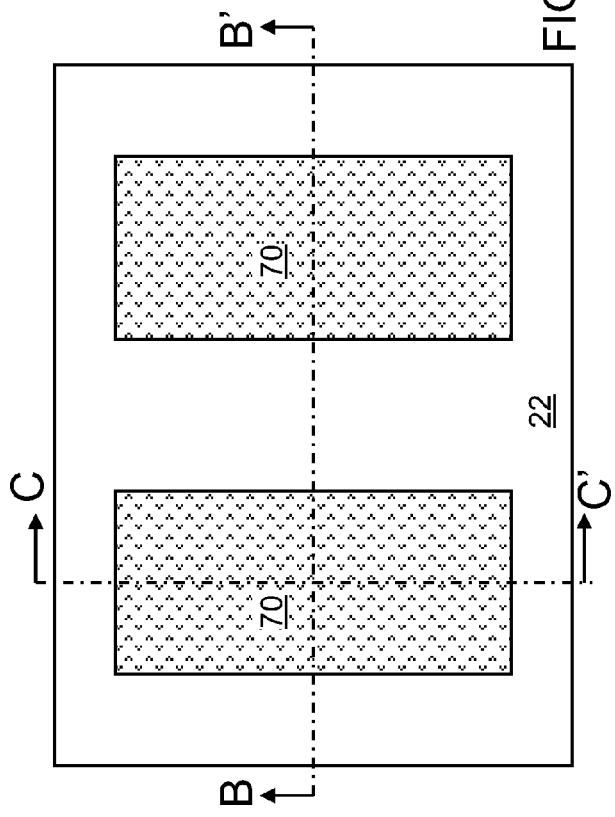
FIGS. 19A, 19B, and 19C are various views of a third exemplary semiconductor structure after planarization of the shallow trench dielectric layer according to a third embodiment of the present disclosure.
Figure 19C:
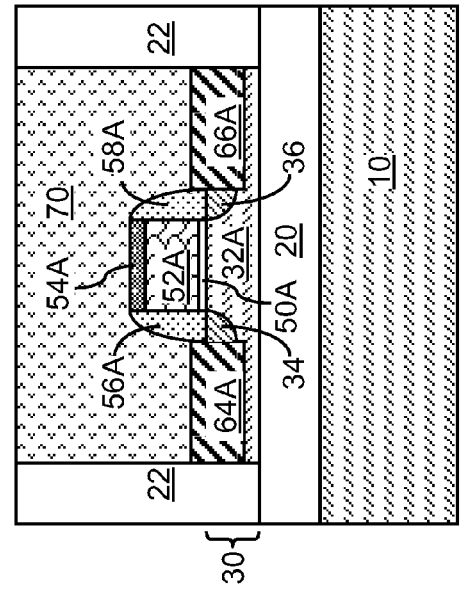
Figure 19B:
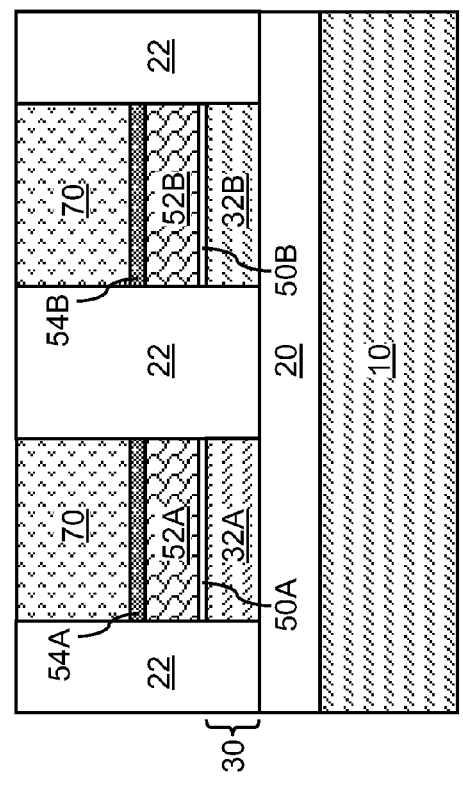

Referring to FIGS. 19A, 19B, and 19C, a third exemplary semiconductor according to a third embodiment of the present disclosure can be derived from the first exemplary semiconductor structure by employing a dielectric material for the planarized material layer 70L that is deposited at the processing step of FIGS. 11A, 11B, and 11C. In the third embodiment, the dielectric material of the planarized material layer 70L can be the same as, or different from any of the dielectric materials present in the first exemplary semiconductor structure of FIGS. 10A, 10B, and 10C. For example, the dielectric material of the planarized material layer 70L, and consequently, the dielectric material of the planarized material portions 70, can be silicon oxide, silicon nitride, silicon oxynitride, a dielectric metal oxide having a dielectric constant greater than 8.0, organosilicate glass, or any dielectric material that can be employed in a metal interconnect structure in the art.

The processing steps of FIGS. 12A-12C, 13A-13C, and 14A-14C are subsequently performed. The shallow trench dielectric layer 22L is planarized after performing the processing steps of FIGS. 14A-14C. The planarization of the shallow trench dielectric layer 22L can be performed, for example, by chemical mechanical planarization.

In one embodiment, the top surfaces of the planarized material portions 70 can be employed as a stopping layer for the planarization step. In this embodiment, the top surface of the shallow trench isolation structure 22 is coplanar with top surfaces of the planarized material portions 70 after the planarization. Sidewalls of the shallow trench isolation structure 22 are in physical contact with sidewalls of the gate electrodes (52A, 52B). The interfaces between the shallow trench isolation structure 22 and the gate electrodes (52A, 52B) can be vertical.

The processing steps of FIGS. 15A-15C and 16A-16C are omitted in the third embodiment. Thus, the planarized material portions 70 remain over the gate stacks (50A, 52A, 54A, 50B, 52B, 54B) and the gate spacers (56A, 58A, 56B, 58B).

Figure 20C:
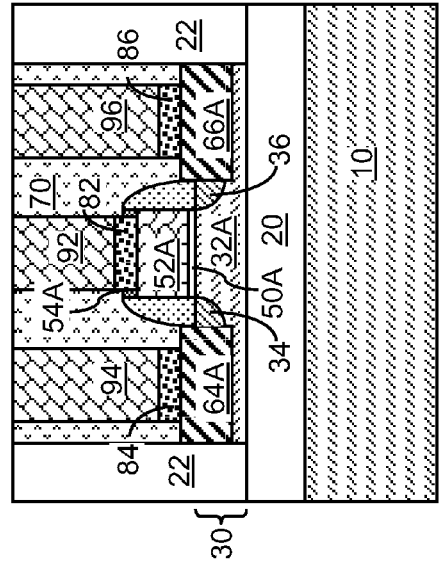
FIGS. 20A, 20B, and 20C are various views of the third exemplary semiconductor structure after formation of a contact-level dielectric layer, various metal-semiconductor alloy portions, and various contact structures according to the third embodiment of the present disclosure.
Figure 20A:
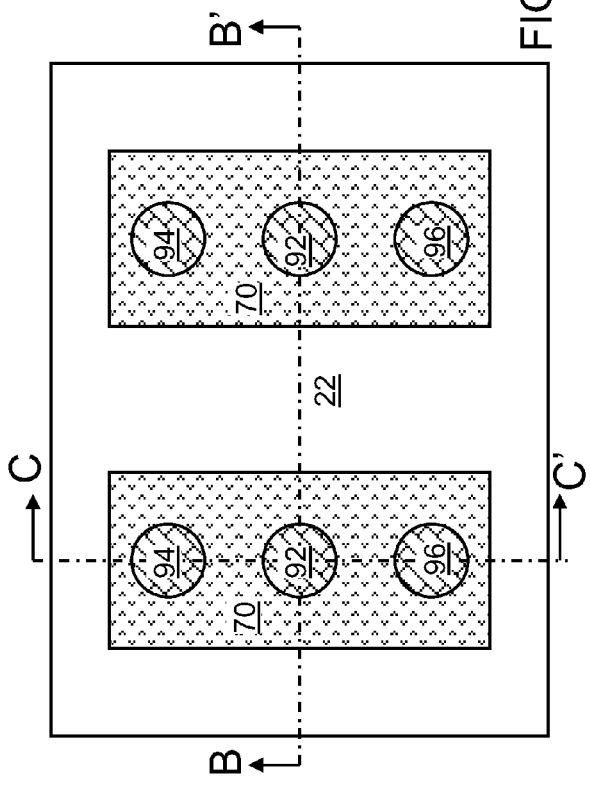
Figure 20B:
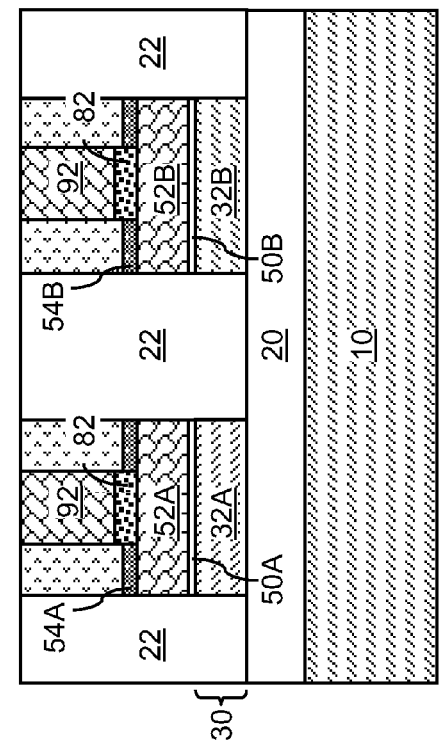

Referring to FIGS. 20A, 20B, and 20C, a contact-level dielectric layer 90, various metal-semiconductor alloy portions (84, 86, 82), and various contact structures (94, 96, 92) can be formed as in the first embodiment.

Referring to FIGS. 21A, 21B, and 21C, a fourth exemplary semiconductor structure according to a fourth embodiment of the present disclosure can be derived from the second exemplary semiconductor structure by substituting a bulk semiconductor substrate instead of an SOI substrate. In the fourth exemplary semiconductor structure, the first conductivity type well 32A and the second conductivity type well 32B can be formed within the upper portion of the bulk semiconductor substrate. The portion of the bulk semiconductor substrate below the first conductivity type well 32A and the second conductivity type well 32B can be a single crystalline semiconductor portion 10' that is in epitaxial alignment with the first conductivity type well 32A and the second conductivity type well 32B.

Referring to FIGS. 22A, 22B, and 22C, a fifth exemplary semiconductor structure according to a fifth embodiment of the present disclosure can be derived from the first exemplary semiconductor structure of FIGS. 10A-10C by applying a photoresist 177 thereupon and lithographic pattering the photoresist 177. The photoresist 177 of the fifth embodiment can be lithographically patterned to include the same pattern as in the first embodiment.

Thus, an anisotropic etch can be performed employing the photoresist 177 as an etch mask layer to form the fifth exemplary semiconductor structure illustrated in FIGS. 23A, 23B, and 23C, which can be the same as the first exemplary semiconductor structure of FIGS. 13A, 13B, and 13C except for the absence of the planarized material portions 70 in the fifth exemplary semiconductor structure of FIGS. 23A, 23B, and 23C.

A self-planarizing deposition method can be employed to deposit a dielectric material within the shallow trench 21 so that a shallow trench isolation structure 22 is formed as illustrated in FIGS. 24A, 24B, and 24C. The self-planarizing deposition method can be spin-on coating or a selective oxide deposition process described in U.S. Patent Application No. 2003/0027401 to Ravi Iyer et al. titled "Method for trench isolation by selective deposition of low temperature oxide films."

Referring to FIGS. 25A, 25B, and 25C, a contact-level dielectric layer 90, various metal-semiconductor alloy portions (84, 86, 82), and various contact structures (94, 96, 92) can be formed as in the first embodiment.

Figure 26A:
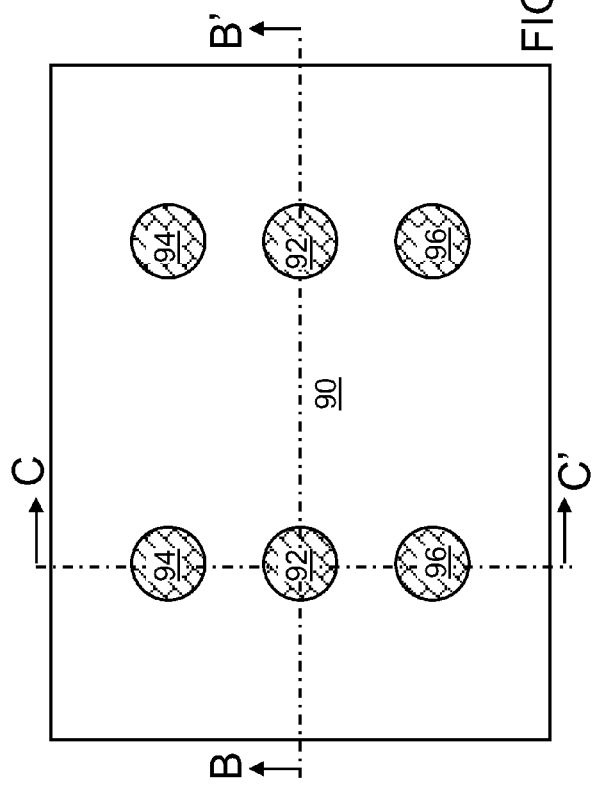
FIGS. 26A, 26B, and 26C are various views of a sixth exemplary semiconductor structure according to a sixth embodiment of the present disclosure.
Figure 26C:
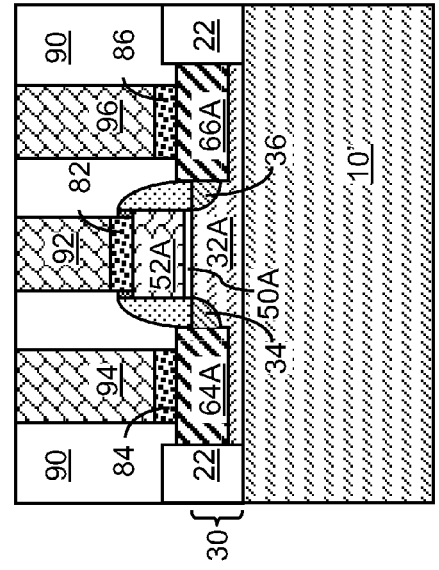
Figure 26B:
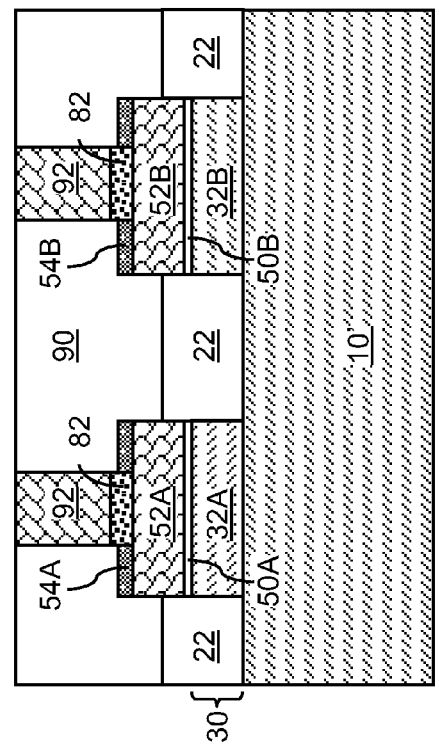

Referring to FIGS. 26A, 26B, and 26C, a sixth exemplary semiconductor structure according to a sixth embodiment of the present disclosure can be derived from the fifth exemplary semiconductor structure by substituting a bulk semiconductor substrate instead of an SOI substrate. In the sixth exemplary semiconductor structure, the first conductivity type well 32A and the second conductivity type well 32B can be formed within the upper portion of the bulk semiconductor substrate. The portion of the bulk semiconductor substrate below the first conductivity type well 32A and the second conductivity type well 32B can be a single crystalline semiconductor portion 10' that is in epitaxial alignment with the first conductivity type well 32A and the second conductivity type well 32B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
   a gate stack including a gate dielectric and a gate electrode and located on a semiconductor substrate; and
   a shallow trench isolation structure comprising a dielectric material and laterally surrounding a contiguous set of at least one semiconductor portion located in said semiconductor substrate, wherein said shallow trench isolation structure is in physical contact with said set of at least one semiconductor portion and a sidewall of said gate electrode.

2. The semiconductor structure of claim 1, further comprising:
   a source-side gate spacer having a first sidewall contacting another sidewall of said gate electrode; and
   a drain-side gate spacer having a second sidewall contacting yet another sidewall of said gate electrode, wherein said drain-side gate spacer is not contiguous with said source-side gate spacer.

3. The semiconductor structure of claim 1, wherein a sidewall of said gate electrode is vertically coincident with a sidewall of one of said at least one semiconductor portion.

4. The semiconductor structure of claim 1, wherein said contiguous set of said at least one semiconductor portion includes a single crystalline semiconductor portion underlying said gate electrode and having a first lattice constant, an embedded single crystalline source region laterally contacting said single crystalline semiconductor portion and having a second lattice constant different from said first lattice constant, and an embedded drain region laterally contacting said single crystalline semiconductor portion and having said second lattice constant.

5. The semiconductor structure of claim 4, wherein each of said embedded source region and said embedded drain region has a top surface that contacts sidewalls of said shallow trench isolation structure at right angle throughout an entirety of a periphery of said top surface that is in contact with said shallow trench isolation structure.

6. The semiconductor structure of claim 1, further comprising a contact-level dielectric layer overlying said gate electrode, vertically contacting said shallow trench isolation structure, and laterally contacting an upper portion of said sidewall of said gate electrode.

7. The semiconductor structure of claim 1, further comprising a planarized material portion comprising another dielectric material and having a sidewall that is vertically coincident with said sidewall of said gate electrode.

8. The semiconductor structure of claim 7, wherein said planarized material portion has a top surface that is coplanar with a top surface of said shallow trench isolation structure.

9. The semiconductor structure of claim 1, wherein a sidewall of said gate electrode is within a same vertical plane as a sidewall of one of said at least one semiconductor portion.

10. The semiconductor structure of claim 9, further comprising at least one gate spacer located on a sidewall of said gate electrode, wherein a sidewall of one of said at least one gate spacer is within said same vertical plane.

11. The semiconductor structure of claim 10, wherein said at least one gate spacer is a pair of a source-side gate spacer and a drain-side gate spacer that are laterally spaced from each other by said gate electrode and do not contact each other.

12. The semiconductor structure of claim 9, wherein said contiguous set of at least one semiconductor portion includes sidewalls that are within said same vertical plane.

* * * * *